(12) United States Patent
Huang et al.

(10) Patent No.: US 11,516,919 B2
(45) Date of Patent: Nov. 29, 2022

(54) DISPLAY DEVICE

(71) Applicant: InnoLux Corporation, Miao-Li County (TW)

(72) Inventors: Wan-Ling Huang, Miao-Li County (TW); Jian-Jung Shih, Miao-Li County (TW); Tsau-Hua Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 19 days.

(21) Appl. No.: 17/114,917

(22) Filed: Dec. 8, 2020

(65) Prior Publication Data
US 2021/0267062 A1 Aug. 26, 2021

Related U.S. Application Data

(60) Provisional application No. 62/979,436, filed on Feb. 21, 2020.

(30) Foreign Application Priority Data

Nov. 6, 2020 (CN) .......................... 202011229622.3

(51) Int. Cl.
*H05K 1/18* (2006.01)
*H01L 27/12* (2006.01)
(Continued)

(52) U.S. Cl.
CPC ........... *H05K 1/181* (2013.01); *H01L 27/124* (2013.01); *H05K 1/147* (2013.01); *H01L 25/048* (2013.01);
(Continued)

(58) Field of Classification Search
CPC ..................................... H05K 1/181
(Continued)

(56) References Cited

U.S. PATENT DOCUMENTS 9,832,868 B1 11/2017 Wright et al.
2016/0179453 A1 6/2016 Jepsen et al.
(Continued)

FOREIGN PATENT DOCUMENTS

CN 103918021 B 5/2016
CN 109739057 A 5/2019
(Continued)

OTHER PUBLICATIONS

Chinese Language Office Action dated Jul. 19, 2021 for the corresponding TW application No. 109138809.
(Continued)

*Primary Examiner* — Stanley Tso
(74) *Attorney, Agent, or Firm* — McClure, Qualey & Rodack, LLP

(57) ABSTRACT

A display device is provided. The display device includes an auxiliary substrate, a display substrate, and a circuit board. The auxiliary substrate includes an auxiliary circuit. The display substrate is disposed on the auxiliary substrate. The display substrate includes a circuit. The circuit board is electrically connected to the auxiliary substrate. The circuit of the display substrate is electrically connected to the auxiliary circuit through a first conductive via, and the circuit board provides a signal to the auxiliary circuit.

18 Claims, 13 Drawing Sheets

(51) Int. Cl.
    *H05K 1/14*         (2006.01)
    *H01L 25/18*       (2006.01)
    *H01L 25/075*     (2006.01)
    *H01L 25/04*       (2014.01)

(52) U.S. Cl.
    CPC .......... *H01L 25/0753* (2013.01); *H01L 25/18* (2013.01); *H05K 2201/056* (2013.01); *H05K 2201/10128* (2013.01)

(58) Field of Classification Search
    USPC ........................................................ 361/749
    See application file for complete search history.

(56) References Cited

U.S. PATENT DOCUMENTS

| | | |
|---|---|---|
| 2017/0048990 A1 | 2/2017 | Sim et al. |
| 2017/0170255 A1* | 6/2017 | Ha .................... H01L 27/3276 |
| 2017/0351475 A1 | 12/2017 | Meersman et al. |

FOREIGN PATENT DOCUMENTS

| | | |
|---|---|---|
| TW | 201242414 A | 10/2012 |
| TW | 201443516 A | 11/2014 |

OTHER PUBLICATIONS

Extended European Search Report dated Jun. 1, 2021, issued in application No. EP 20213081.1.

* cited by examiner

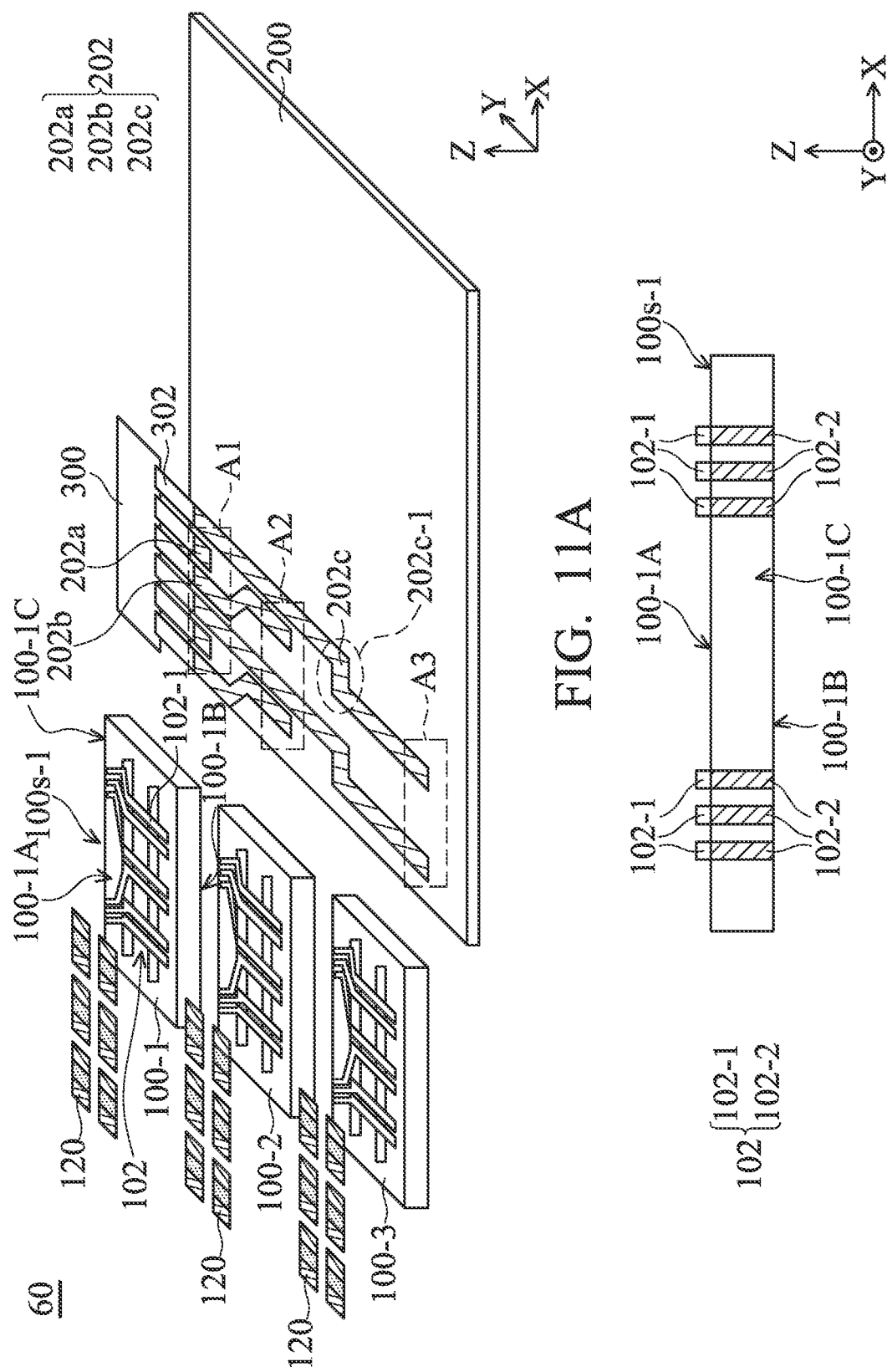

DISPLAY DEVICE

CROSS REFERENCE TO RELATED APPLICATIONS

This application claims the benefit of U.S. Provisional Application No. 62/979,436, filed on Feb. 21, 2020, and claims priority of China Patent Application No. 202011229622.3, filed on Nov. 6, 2020, the entirety of which are incorporated by reference herein.

BACKGROUND

Technical Field

The present disclosure relates to a display device, and in particular it relates to the structural design of the display device.

Description of the Related Art

Electronic products equipped with display panels, such as smartphones, tablet computers, notebook computers, displays, and televisions, have become indispensable necessities in modern society. With the flourishing development of these portable electronic products, consumers have high expectations regarding their quality, functionality, or price.

In response to the demand for large-area displays, panel-tiling technique is widely used in the process of manufacturing displays. In order to reduce the interference of the gap at the panel-tiling position on the image display quality, the seamless tiling technique can be used to reduce the visual presence of the panel frame, thereby achieving a seamless visual effect.

However, as the resolution of the display increases, the gap between the tiled panels is also reduced. Limited to the original panel structure or manufacturing process, the difficulty of achieving seamless tiling of the panels is gradually increasing. Therefore, the development of a panel design framework that can improve the reliability or effect of seamless tiling of displays is still one of the current research topics in the industry.

SUMMARY

In accordance with some embodiments of the present disclosure, a display device is provided. The display device includes an auxiliary substrate, a display substrate, and a circuit board. The auxiliary substrate includes an auxiliary circuit. The display substrate is disposed on the auxiliary substrate. The display substrate includes a circuit. The circuit board is electrically connected to the auxiliary substrate. The circuit of the display substrate is electrically connected to the auxiliary circuit through a first conductive via, and the circuit board provides a signal to the auxiliary circuit.

In accordance with some other embodiments of the present disclosure, a display device is provided. The display device includes an auxiliary substrate, a display substrate, and a circuit board. The auxiliary substrate includes an auxiliary circuit. The display substrate is disposed on the auxiliary substrate. The display substrate has an upper surface and a side surface. The side surface is connected to the upper surface. The display substrate includes a circuit, and the circuit has a transmission portion and a connection portion connected to the transmission portion. The transmission portion is disposed on the upper surface, and the connection portion is disposed on the side surface. The circuit board is electrically connected to the auxiliary substrate. The transmission portion of the circuit is electrically connected to the auxiliary circuit through the connection portion, and the circuit board provides a signal to the auxiliary circuit.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 11A is a structural diagram of a display device before assembly in accordance with some embodiments of the present disclosure;

FIG. 11B is a side-view diagram of a portion of a display device in accordance with some embodiments of the present disclosure;

DETAILED DESCRIPTION

Figure 1:
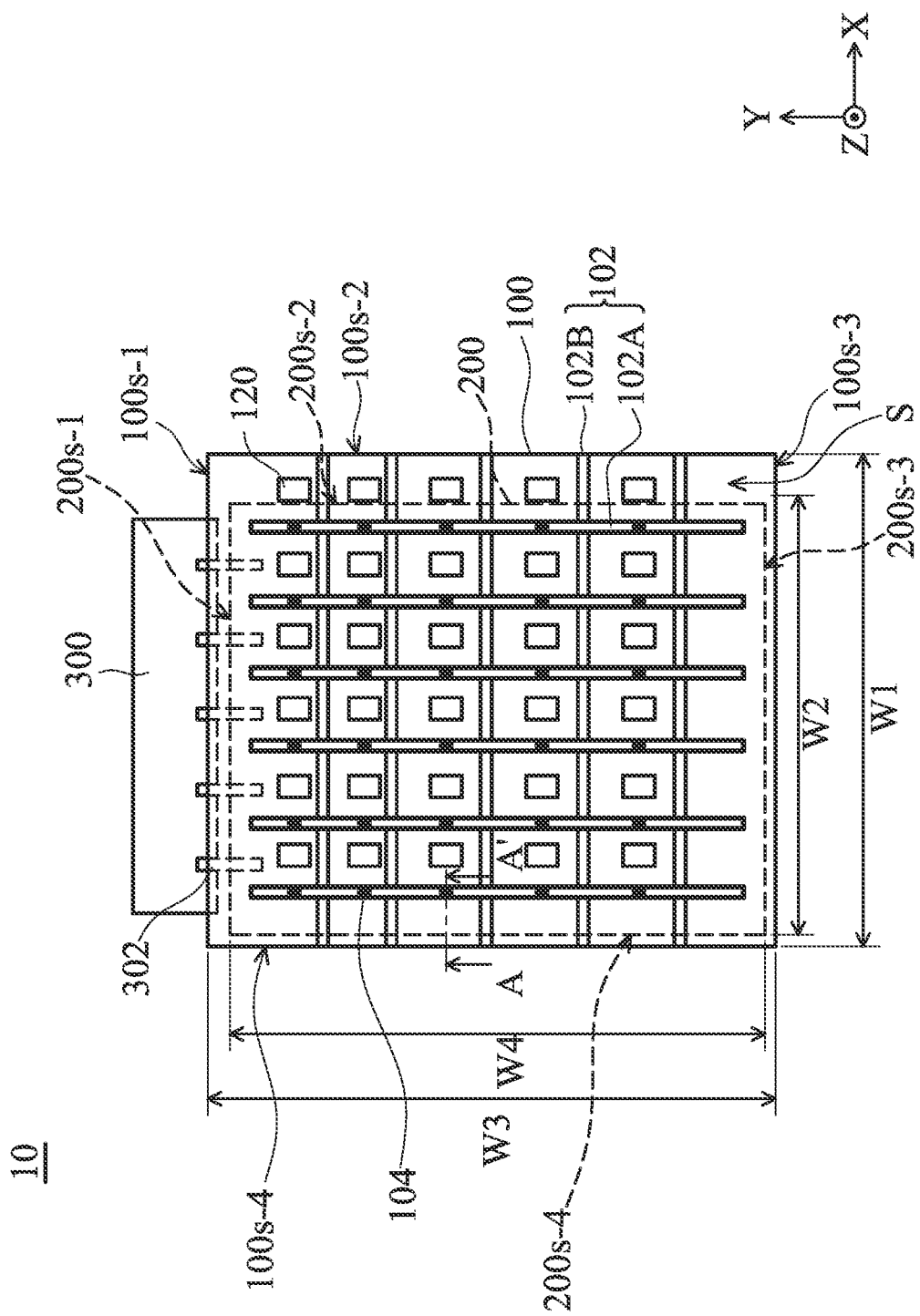
FIG. 1 is a top-view diagram of a display device in accordance with some embodiments of the present disclosure.

The display device of the present disclosure is described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. The embodiments are used merely for the purpose of illustration and the present disclosure is not limited thereto. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The present disclosure can be understood by referring to the following detailed description in connection with the accompanying drawings. It should be noted that, in order to allow the reader to easily understand the drawings, several drawings in the present disclosure only depict a portion of the display device, and the specific elements in the drawings are not drawn to scale. In addition, the number and size of each element in the drawings are only for illustration, and are not limited the scope of the present disclosure.

It should be noted that the elements or devices in the drawings of the present disclosure may be present in any form or configuration known to those with ordinary skill in the art. In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. Moreover, the expressions such as "first material layer disposed on/over a second material layer", may indicate the direct contact of the first material layer and the second material layer, or it may indicate an indirect contact state with one or more intermediate layers between the first material layer and the second material layer. In the above situation, the first material layer may not be in direct contact with the second material layer.

Throughout the present disclosure and the appended claims, certain terms are used to refer to specific elements. Those skilled in the art should understand that electronic device manufacturers may refer to the same element with different names. The present disclosure does not intend to distinguish between elements that have the same function but different names. In the specification and claims, the terms "comprising", "including", "having" and the like are open-ended phrases, so they should be interpreted as "including but is not limited to . . . ". Therefore, when the terms "comprising", "including" and/or "having" are used in the description of the present disclosure, they specify the corresponding features, regions, steps, operations and/or components, but do not exclude the existence of one or more corresponding features, regions, steps, operations and/or components.

Directional terms mentioned in the present disclosure, such as "upper", "lower", "front", "rear", "left", "right", etc., are only the directions referring to the drawings. Therefore, the directional terms are used for illustration, not for limiting the present disclosure. In the drawings, each drawing depicts general features of methods, structures, and/or materials used in particular embodiments. However, these drawings should not be interpreted as defining or limiting the scope or property encompassed by these embodiments. For example, for clarity, the relative sizes, thicknesses, and positions of the various layers, regions, and/or structures may be reduced or enlarged.

In accordance with some embodiments of the present disclosure, terms such as "connect" and "interconnect" with respect to joint and connection, unless specifically defined, may refer to the two structures being in direct contact, or may refer to the two structures not being in direct contact, there being other structures between these two structures. In addition, terms related to joints and connection may also include a situation where both structures are movable or both structures are fixed. In addition, the term "electrical connection" or "electrically coupled" or "electrically connected" includes any direct and indirect electrical connection means.

In addition, it should be understood that, the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is used to make a component with a certain name can be clearly distinguished from another component with the same name. The same words may not be used in the claims and the specification. Accordingly, the first component in the specification may be the second component in the claims.

The terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The stated value of the present disclosure is an approximate value. When there is no specific description, the stated value includes the meaning of "about" or "substantially". In addition, the term "in a range from the first value to the second value" means that the range includes the first value, the second value, and other values in between.

It should be noted that the following embodiments can replace, recombine, and mix features in several different embodiments to complete other embodiments without departing from the spirit of the present disclosure. The features between the various embodiments can be mixed and used arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, a display device is provided. The display device includes a display substrate, a circuit board and an auxiliary substrate. A circuit on the display substrate is electrically connected to an auxiliary circuit on the auxiliary substrate. With the configuration design of the display substrate, the auxiliary substrate and the circuit board, a signal driving terminal can be disposed on a backside of the display substrate, which can reduce the space occupied by the related circuits or wiring of the display substrate or reduce the space required for tiling panels. In accordance with some embodiments of the present disclosure, the display device can improve the reliability of the panel-tiling technique or increase its usability in high-resolution display devices. The interference of the gap at the panel-tiling position on the image display quality can be reduced, or the seamless visual effect may be substantially achieved.

The embodiments of the present disclosure can be applied to various electronic devices, such as a display device, a light-emitting device, a touch device, a sensing device, an antenna device, a tiled device, or a combination thereof, but it is not limited thereto. The electronic device may be a bendable or flexible electronic device, but it is not limited thereto. In accordance with some embodiments, the electronic device may include light-emitting diode (LED), liquid crystal, fluorescence, phosphor, quantum dot (QD), another suitable medium, or a combination thereof, but it is not limited thereto. The light-emitting diode may include, for example, an organic light-emitting diode (OLED), an inorganic light-emitting diode, a mini light-emitting diode (mini LED), a micro light-emitting diode (micro LED), quantum dot light-emitting diode (for example, QLED or QDLED), another suitable material, or any combination thereof, but it is not limited thereto. The antenna device may include, for example, a liquid-crystal antenna device, but it is not limited thereto. In accordance with the embodiments of the present disclosure, the electronic device can be any permutation and combination described above, but it is not limited thereto. In addition, the shape of the electronic device can be rectangular, circular, polygonal, irregular, a shape with curved edges, or another suitable shape, and the electronic device can have peripheral systems such as a driving system, a control system, a light source system, or a shelf system to support the display device or antenna device.

Figure 2:
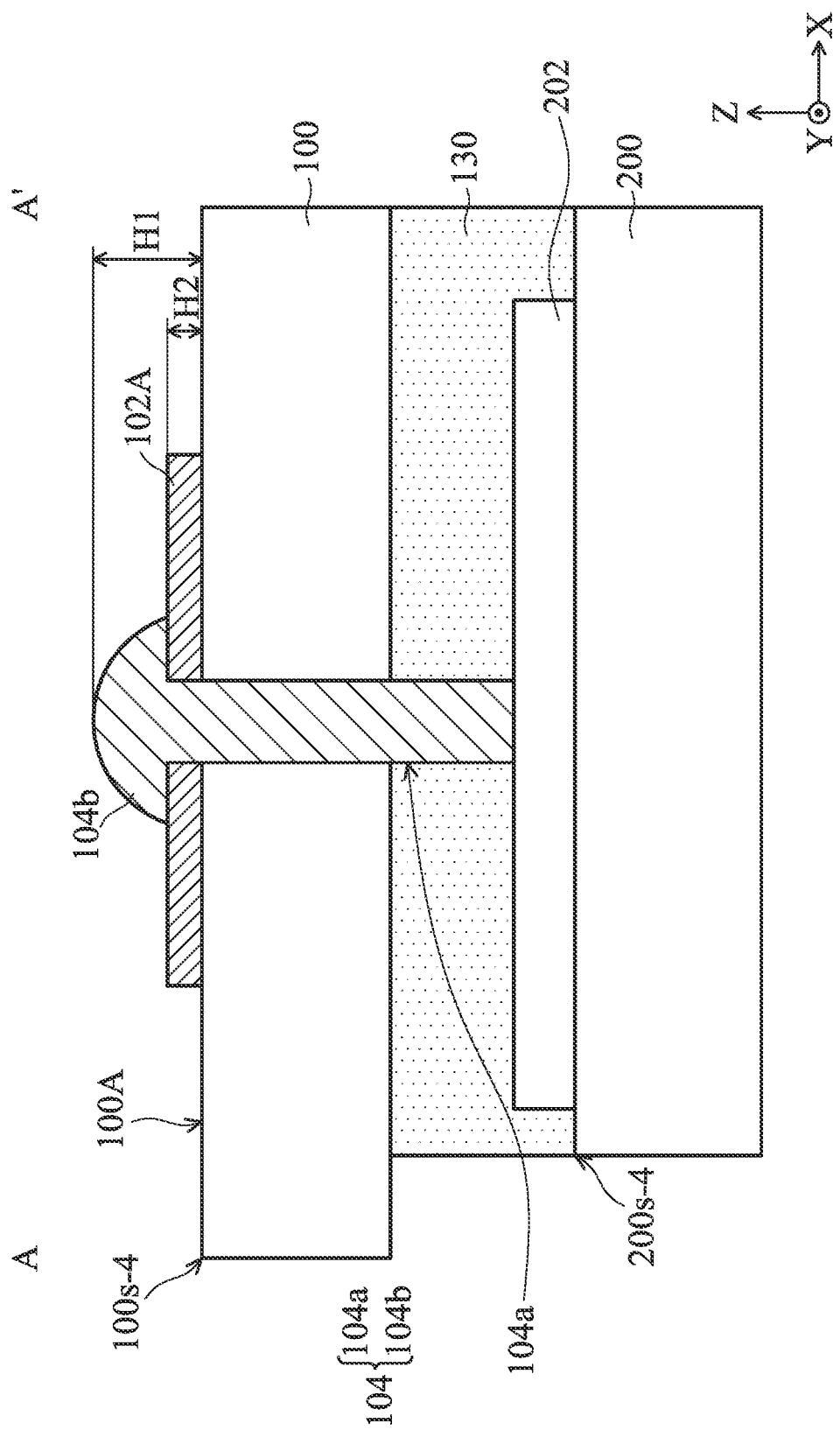
FIG. 2 is a cross-sectional diagram of the display device taken along section line A-A' in FIG. 1 in accordance with some embodiments of the present disclosure.

As described above, the following description will take a display device as an example to illustrate the implementation of the present disclosure. Refer to FIG. 1 and FIG. 2. FIG. 1 is a top-view diagram of a display device 10 in accordance with some embodiments of the present disclosure. FIG. 2 is a cross-sectional diagram of the display device taken along section line A-A' in FIG. 1 in accordance with some embodiments of the present disclosure. It should be understood that, for clear description, some elements of the display device 10 are omitted in the drawing, and only some elements are shown schematically. In accordance with some embodiments, additional features can be added to the display device 10 described below. In accordance with some other embodiments, some of the features of the display device 10 described below may be replaced or omitted.

As shown in FIG. 1 and FIG. 2, the display device 10 may include a display substrate 100, an auxiliary substrate 200, and a circuit board 300. The display substrate 100 may be disposed on the auxiliary substrate 200, and the circuit board 300 may be electrically connected to the auxiliary substrate 200. In accordance with some embodiments, the auxiliary substrate 200 may include an auxiliary circuit 202 (as shown in FIG. 2), the display substrate 100 may include a circuit 102, and the circuit 102 of the display substrate 100 may be electrically connected to the auxiliary circuit 202 through a conductive via 104. In addition, the circuit board 300 may provide a signal to the auxiliary circuit 202.

Specifically, in accordance with some embodiments, the display substrate 100 may be at least partially overlapped with the auxiliary substrate 200 in a normal direction of the display substrate 100 (for example, the Z direction in the figure). In accordance with some embodiments, the display substrate 100 may include the circuit 102, and the circuit 102 may include a plurality of signal lines. In accordance with some embodiments, the signal lines may include, for example, a current signal line, a voltage signal line, a high-frequency signal line, or a low-frequency signal line, and the signal lines can transmit a signal, for example an operating voltage (VDD), a common ground voltage (VSS), or the signal can drive a device terminal (e.g., a thin-film transistor (TFT)), but the present disclosure is not limited thereto. For example, in accordance with some embodiments, as shown in FIG. 1, the circuit 102 may include a signal line 102A and a signal line 102B. In accordance with some embodiments, the signal line 102A and the signal line 102B may be a data line and a scan line, respectively, but is not limited thereto. In accordance with some embodiments, the auxiliary circuit 202 may be, for example, a power line, but it is not limited thereto. It should be understood that the number of signal lines included in the circuit 102 is not limited to that shown in the figure. In accordance with different embodiments, the display device 10 may include another suitable type or number of circuits 102.

In accordance with some embodiments, the display substrate 100 may include a flexible substrate, a rigid substrate, or a combination thereof. In accordance with some embodiments, the material of the display substrate 100 may include glass, quartz, sapphire, ceramic, polyimide (PI), polycarbonate (PC), polyethylene terephthalate (PET), polypropylene (PP), another suitable material, or a combination thereof, but it is not limited thereto. In addition, the light transmittance of the display substrate 100 is not limited, that is, the display substrate 100 may be a light-transmitting substrate, a semi-transmitting substrate, or a non-transmitting substrate.

As shown in FIG. 1, in accordance with some embodiments, the display substrate 100 may have four sides, namely, side 100s-1, side 100s-2, side 100s-3, and side 100s-4. The side 100s-1 is opposite the side 100s-3, and the side 100s-2 is opposite the side 100s-4, but it is not limited thereto. In some embodiments, the side 100s-3 may be located between the side 100s-2 and the side 100s-4. In yet another embodiment, the side 100s-4 is connected to the side 100s-3. In accordance with some embodiments, the display substrate 100 may be quadrilateral, circular, polygonal, or free shape, and the quadrilateral may include trapezoids, squares, rectangles, rhombuses, etc., but the present disclosure is not limited thereto.

In accordance with some embodiments, the material of the circuit 102 may include a metal conductive material, a transparent conductive material, another suitable material, or a combination thereof, but it is not limited thereto. The metal conductive material may include copper (Cu), silver (Ag), gold (Au), tin (Sn), aluminum (Al), molybdenum (Mo), tungsten (W), chromium (Cr), nickel (Ni), platinum (Pt), titanium (Ti), any of the foregoing metal alloys, another suitable material, or a combination thereof, but it is not limited thereto. The transparent conductive material may include a transparent conductive oxide (TCO), for example, may include indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material, or a combination thereof, but it is not limited thereto.

In addition, in accordance with some embodiments, the signal line 102A and the signal line 102B may be electrically connected to a driving element (not illustrated), and the driving element may be disposed on the display substrate 100. In accordance with some embodiments, the driving element may include an active driving element, a passive driving element, or a combination thereof.

For example, the active driving element may include thin-film transistors (TFT), but it is not limited thereto. The thin-film transistor may include, for example, a switching transistor, a driving transistor, a reset transistor, or other thin-film transistors. In addition, the thin-film transistor may be a top gate thin-film transistor, a bottom gate thin-film transistor, or a dual gate or double gate thin-film transistor. In accordance with some embodiments, the thin-film transistor may include at least one semiconductor layer, and the semiconductor layer may include silicon, metal oxide, another suitable material, or a combination thereof, but it is not limited thereto. The silicon may include amorphous silicon, low-temperature polysilicon (LTPS), another suitable material, or a combination thereof, but it is not limited thereto. The metal oxide may include indium gallium zinc oxide (IGZO), indium zinc oxide (IZO), indium gallium zinc tin oxide (IGZTO), another suitable material, or a combination thereof, but it is not limited thereto. In accordance with some embodiments, different thin-film transistors may have different semiconductor materials as described above.

Furthermore, in the embodiments where the driving element is a passive driving element, for example, an integrated circuit (IC) or a microchip may be used to control the driving element, but the present disclosure is not limited thereto.

As shown in FIG. 1 and FIG. 2, in accordance with some embodiments, the display device 10 may include a plurality of light-emitting elements 120, and the light-emitting elements 120 may be disposed on the display substrate 100. In accordance with some embodiments, the light-emitting elements 120 may be disposed on the aforementioned thin-film transistor (not illustrated), and the light-emitting elements 120 may be electrically connected to the thin-film transistor. In accordance with some embodiments, the thin-film transistor may be electrically connected to the auxiliary circuit 202 through the conductive via 104.

In accordance with some embodiments, at least one of the plurality of light-emitting elements 120 may be a die of light-emitting diode. For example, the light-emitting element 120 may include a micro-LED, a mini-LED, an organic light-emitting diode (OLED), or a quantum dot light-emitting diode (QLED, QDLED), but it is not limited thereto. In accordance with some embodiments, the light-emitting elements 120 may be arranged in an array. In accordance with some embodiments, one light-emitting element 120 may correspond to one pixel, and the pixel may include an appropriate number of sub-pixels. In accordance with some embodiments, one light-emitting element 120 may correspond to one sub-pixel. In accordance with some embodiments, the pixel or sub-pixel may have a single color or multiple colors, for example, the pixel with three colors of red, green and blue, or the pixel with four colors of red, green, blue and white, or another suitable color, or another suitable number of colors, but the present disclosure is not limited thereto. In an embodiment, the sub-pixel may be an area enclosed by the signal lines 102A and the signal lines 102B. In another embodiment, if the area enclosed by the signal lines 102A and the signal lines 102B has multiple colors, the area enclosed by the signal lines 102A and the signal lines 102B is referred to as a sub-pixel.

In accordance with some embodiments, the packaging method of the light-emitting elements 120 may include surface-mount device (SMD) packaging of light-emitting diodes, chip-on-board (COB) packaging of light-emitting diodes, packaging of micro light-emitting diodes or flip-chip light-emitting diodes, packaging of organic light-emitting diodes, another suitable packaging method, or a combination thereof, but it is not limited thereto.

Furthermore, the auxiliary circuit 202 may be disposed on the auxiliary substrate 200, and the circuit 102 disposed on the display substrate 100 may be electrically connected to the auxiliary circuit 202 through the conductive via 104. In accordance with some embodiments, the auxiliary circuit 202 can transmit a signal to the circuit 102 to control the turn-on, turn-off or brightness of the light-emitting element 120.

In accordance with some embodiments, the auxiliary substrate 200 may include a flexible substrate, a rigid substrate, or a combination thereof. In accordance with some embodiments, the material of the auxiliary substrate 200 may include glass, quartz, sapphire, ceramic, polyimide, polycarbonate, polyethylene terephthalate, polypropylene, another suitable material, or a combination thereof, but it is not limited thereto. In addition, the light transmittance of the auxiliary substrate 200 is not limited, that is, the auxiliary substrate 200 may be a light-transmitting substrate, a semi-transmitting substrate, or a non-transmitting substrate. Furthermore, the material of the auxiliary substrate 200 may be the same as or different from the material of the display substrate 100.

In accordance with some embodiments, the auxiliary substrate 200 may also have four sides, namely, side 200s-1, side 200s-2, side 200s-3, and side 200s-4. The side 200s-1 is opposite the side 200s-3, and the side 200s-2 is opposite the side 200s-4, but it is not limited thereto. In some embodiments, the side 200s-3 may be located between the side 200s-4 and the side 200s-2. In yet another embodiment, the side 200s-4 is connected to the side 200s-3. In accordance with some embodiments, the auxiliary substrate 200 may be quadrilateral, circular, polygonal, or free shape, and the quadrilateral may include trapezoid, square, rectangle, rhombus, etc., but the present disclosure is not limited thereto. Furthermore, the shape of the auxiliary substrate 200 may be the same as or different from the shape of the display substrate 100.

In accordance with some embodiments, the side 100s-3 of the display substrate 100 is adjacent to the side 200s-3 of the auxiliary substrate 200. In addition, in the X direction, a width W1 of the side 100s-3 of the display substrate 100 may be greater than a width W2 of the side 200s-3 of the auxiliary substrate 200. The design of the width W1 greater than the width W2 allows the display substrate 100 to create a space at the side 100s-3, such as a space S. Therefore, some elements or mechanisms of the display substrate 100 and/or the display device 10 can be arranged in the aforementioned space S. In this way, a peripheral area of the display substrate 100 can be reduced to achieve a narrow border effect, or a usable space of the display device 10 can be increased. In accordance with the embodiments of the present disclosure, the X direction can be defined as the substantially extending direction of the signal line 102B. Furthermore, the width of an object referred to in the present disclosure is the maximum width of an object.

In accordance with some embodiments, the side 100s-3 may be substantially parallel or non-parallel to the side 200s-3. Furthermore, in accordance with some embodiments, the side 100s-4 of the display substrate 100 is adjacent to the side 200s-4 of the auxiliary substrate 200. In addition, in the Y direction, a width W3 of the side 100s-4 of the display substrate 100 may be greater than or equal to a width W4 of the side 200s-4 of the auxiliary substrate 200. In accordance with the embodiments of the present disclosure, the Y direction can be defined as the substantially extending direction of the signal line 102A.

In addition, in accordance with some embodiments of the present disclosure, an optical microscope (OM), a scanning electron microscope (SEM), a film thickness profiler (α-step), an ellipsometer or other suitable machine may be used to measure the width, length, area, or thickness of each element or a distance between the elements. Specifically, in accordance with some embodiments, a scanning electron microscope may be used to obtain any cross-sectional image including the elements to be measured, and the width, length, area, or thickness of each element or the distance between elements in the image can be measured.

In accordance with some embodiments, the area of the auxiliary substrate 200 may be smaller than the area of the display substrate 100 on a plane (for example, the X-Y plane shown in the figure) that is perpendicular to the normal direction (the Z direction) of the display substrate 100. In accordance with some embodiments, in the normal direction (the Z direction) of the display substrate 100, the side 100s-4 of the display substrate 100 may protrude from the side 200s-4 of the auxiliary substrate 200. In other words, a projection of the auxiliary substrate 200 on the X-Y plane can be located within the projection of the display substrate 100 on the X-Y plane. The area of an object referred to in the present disclosure is the largest area of the object.

Furthermore, in accordance with some embodiments, the auxiliary circuit 202 may be disposed corresponding to the circuit 102 in the normal direction (Z direction) of the display substrate 100 according to design requirements. According to the embodiments of the present disclosure, "the auxiliary circuit 202 is disposed corresponding to the circuit 102" means that the auxiliary circuit 202 at least partially overlaps the circuit 102 in the normal direction (Z direction) of the display substrate 100.

In accordance with some embodiments, the material of the auxiliary circuit 202 may include a metal conductive material, a transparent conductive material, another suitable material, or a combination thereof, but it is not limited thereto. The metal conductive material may include copper, silver, gold, tin, aluminum, molybdenum, tungsten, chromium, nickel, platinum, titanium, any of the foregoing metal alloys, another suitable material, or a combination thereof, but it is not limited thereto. The transparent conductive material may include a transparent conductive oxide, such as indium tin oxide, antimony zinc oxide, tin oxide, zinc oxide, indium zinc oxide, indium gallium zinc oxide, indium tin zinc oxide, antimony tin oxide, another suitable transparent conductive material, or a combination thereof, but it is not limited thereto. Furthermore, the material of the auxiliary circuit 202 may be the same as or different from the material of the circuit 102.

In accordance with some embodiments, a resistance of the auxiliary circuit 202 may be less than, equal to, or greater than a resistance of the circuit 102. In addition, it should be understood that although the signal line 102A and the signal line 102B are both single-layer structures in the illustrated embodiment, the signal line 102A and/or the signal line 102B may have a multi-layer structure in accordance with other embodiments.

As shown in FIG. 2, in accordance with some embodiments, the display device 10 may further include a functional layer 130, and the functional layer 130 may be disposed between the display substrate 100 and the auxiliary substrate 200. In accordance with some embodiments, the functional layer 130 may have an adhesion function, and the display substrate 100 may be fixed to the auxiliary substrate 200. In accordance with some embodiments, the functional layer 130 may protect the auxiliary circuit 202 because it is a moisture-proof layer or it is an insulator, but it is not limited thereto.

In accordance with some embodiments, the material of the functional layer 130 may include a light-curing adhesive material, a heat-curing adhesive material, a light and heat-curing adhesive material, another suitable material, or a combination thereof, but it is not limited thereto. For example, in some embodiments, the material of the functional layer 130 may include optical clear adhesive (OCA), optical clear resin (OCR), another suitable material, or a combination thereof. In some other embodiments, the functional layer 130 may include an encapsulation material, for example, it may include an organic material, an inorganic material, another suitable encapsulation material, or a combination thereof, but it is not limited thereto. In accordance with some embodiments, the aforementioned inorganic material may include silicon nitride, silicon oxide, silicon oxynitride, aluminum oxide, or another suitable material, but it is not limited thereto. In accordance with some embodiments, the aforementioned organic material may include epoxy resin, silicone resin, acrylic resin (e.g., polymethylmetacrylate (PMMA)), benzocyclobutene (BCB), polyimide, polyester, polydimethylsiloxane (PDMS), polyfluoroalkoxy (PFA), another suitable material, or a combination thereof, but it is not limited thereto. Furthermore, the light transmittance of the functional layer 130 is not limited, that is, the functional layer 130 may be light-transmissive, semi-transmissive or non-transmissive.

As shown in FIG. 2, in accordance with some embodiments, the conductive via 104 may penetrate through the display substrate 100 and the functional layer 130 to connect to the circuit 102 and the auxiliary circuit 202.

Specifically, in accordance with some embodiments, the conductive via 104 may include a through hole 104a and a conductive structure 104b. The conductive structure 104b may be disposed in the through hole 104a. The phrase "the conductive structure 104b is disposed in the through hole 104a" means that the conductive structure 104b is entirely disposed in the through hole 104a, or a portion of the conductive structure 104b is disposed in the through hole 104a, and the other portion is disposed outside the through hole 104a. As shown in FIG. 2, a portion of the conductive structure 104b is located in the through hole 104a, and the other portion is located outside the through hole 104a and disposed on the display substrate 100. The through hole 104a may penetrate through the display substrate 100 and the functional layer 130, and the conductive structure 104b may be disposed on the display substrate 100 and electrically connected to the circuit 102 (e.g., the signal line 102A of the circuit 102). In accordance with some embodiments, in the normal direction (Z direction) of the display substrate 100, the conductive structure 104b may protrude from the signal line 102A. In other words, in the normal direction of the display substrate 100, a maximum distance H1 between the conductive structure 104b and an upper surface 100A of the display substrate 100 may be greater than a maximum distance H2 between the signal line 102A and the upper surface 100A of the display substrate 100.

In accordance with some embodiments, the material of the conductive structure 104b may include a conductive material, such as a metal conductive material. In accordance with some embodiments, the metal conductive material may include aluminum, molybdenum, silver, tin, tungsten, gold, chromium, nickel, platinum, copper alloy, aluminum alloy, molybdenum alloy, silver alloy, tin alloy, tungsten alloy, gold alloy, chromium alloy, nickel alloy, platinum alloy, another suitable metal material, or a combination thereof, but it is not limited thereto.

Furthermore, in accordance with some embodiments, the through hole 104a may be formed in the display substrate 100 and the functional layer 130 by one or more photolithography processes and/or etching processes, and then the through hole 104a may be filled with a conductive material to form the conductive structure 104b. In accordance with some embodiments, the photolithography process may include photoresist coating (such as spin coating), soft baking, hard baking, mask alignment, exposure, post-exposure baking, photoresist development, cleaning and drying, etc., but it is not limited thereto. The etching process may include a dry etching process or a wet etching process, but it is not limited thereto. Furthermore, the conductive structure 104b and the through hole 104a may be formed in separate processes, but it is not limited thereto.

As described above, the circuit board 300 may provide signals to the auxiliary circuit 202. Referring to FIG. 1, in accordance with some embodiments, the circuit board 300 may be adjacent to one side of the display substrate 100, for example, the side 100s-1. In accordance with some embodiments, the display device 10 may include a plurality of circuit boards 300, and the circuit boards 300 may be respectively disposed adjacent to the same side or different sides of the display substrate 100.

In accordance with some embodiments, the circuit board 300 may include a rigid substrate or a flexible substrate. In accordance with some embodiments, the circuit board 300 may be a printed circuit board (PCB), but it is not limited thereto. In accordance with some embodiments, the substrate of the circuit board 300 may include ceramic, aluminum, copper, glass fiber, another suitable material, or a combination thereof, but it is not limited thereto. In accordance with some embodiments, the circuit board 300 may include a metal-glass fiber composite plate, or a metal-ceramic composite plate, but it is not limited thereto.

In addition, as shown in FIG. 1, in accordance with some embodiments, the display device 10 may further include a flexible printed circuit (FPC) board 302, and the auxiliary circuit 202 may be electrically connected to the circuit board 300 through the flexible printed circuit board 302. In accordance with some embodiments, in the normal direction (Z direction) of the display substrate 100, the flexible printed circuit board 302 may be partially overlapped with the display substrate 100 and/or the circuit board 300, and partially overlapped with the auxiliary substrate 200. Furthermore, it should be understood that the number, shape, or location of the flexible printed circuit board 302 are not limited to those shown in the drawings. According to different embodiments, the number and location of the flexible printed circuit board 302 can be adjusted in combination with the circuit board 300 as required.

In accordance with some embodiments, a substrate of the flexible printed circuit board 302 may include polyimide, polycarbonate, polyethylene terephthalate, polypropylene, another suitable material, or a combination thereof, but it is not limited thereto.

In addition, it should be understood that the circuit board 300 and the flexible printed circuit board 302 illustrated in FIG. 1 is the aspect before they are bent (for example, before packaging). In accordance with some embodiments, the flexible printed circuit board 302 may be bent so that the circuit board 300 may be located on a backside of the auxiliary substrate 200, and therefore the circuit board 300 may be at least partially overlapped with the display substrate 100 in the normal direction (Z direction) of the display substrate 100. The aspect of the flexible printed circuit board 302 after being bent will be further described below.

Figure 3:
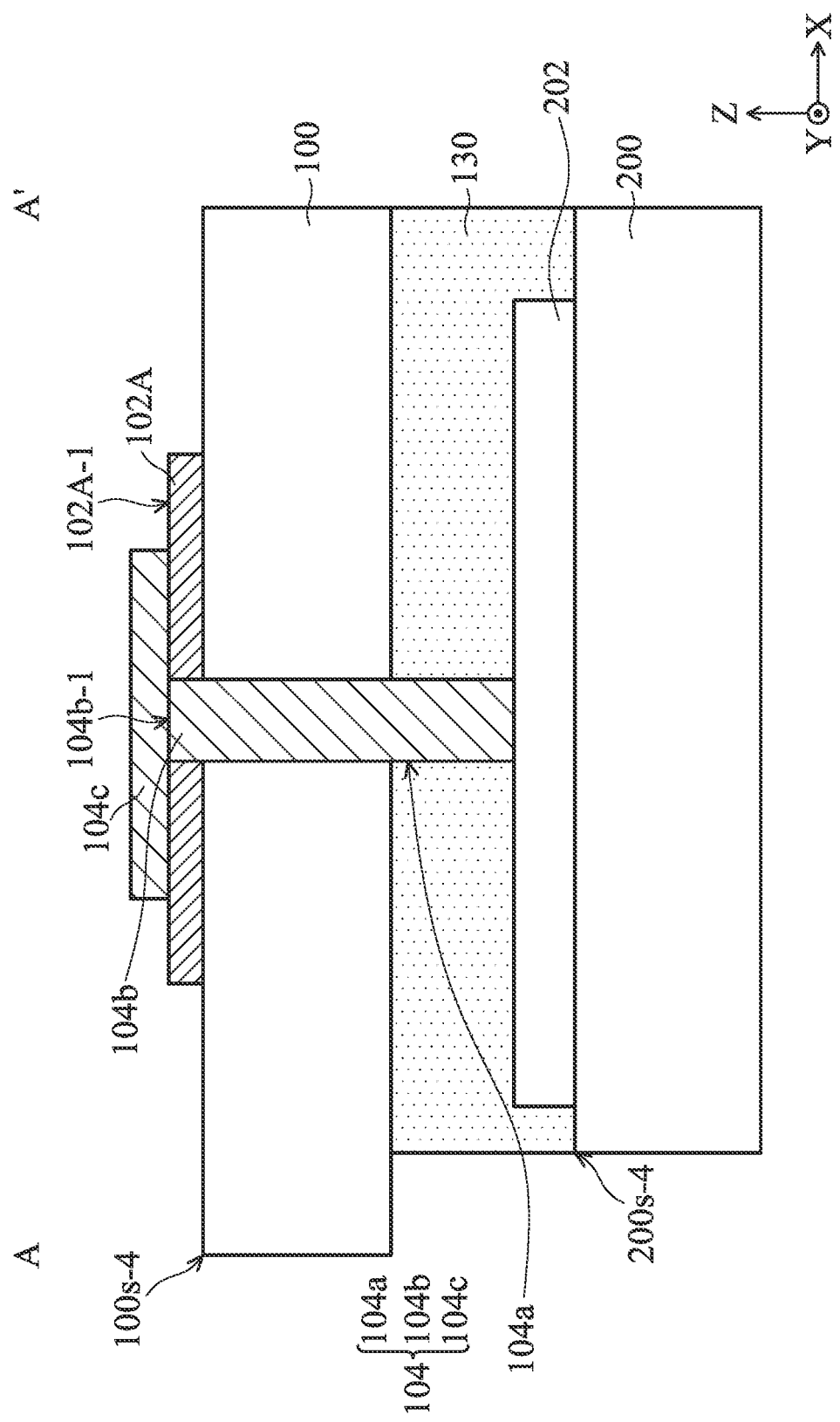
FIG. 3 is a cross-sectional diagram of the display device taken along section line A-A' in FIG. 1 in accordance with some embodiments of the present disclosure.

Next, refer to FIG. 3, which is a cross-sectional diagram of the display device taken along section line A-A' in FIG. 1 in accordance with some embodiments of the present disclosure. It should be understood that the same or similar components (or elements) in the following paragraph will be denoted by the same or similar reference numbers, and their materials, manufacturing methods and functions are the same or similar to those described above, and thus they will not be repeated in the following context.

As shown in FIG. 3, in accordance with some embodiments, the conductive via 104 may further include a conductive structure 104c, and the conductive structure 104c may be disposed on the conductive structure 104b and/or the signal line 102A in the circuit 102. In accordance with some embodiments, the conductive structure 104c may be electrically connected to the auxiliary circuit 202 through the conductive structure 104b. In accordance with some embodiments, a top surface 104b-1 of the conductive structure 104b may be substantially aligned with or parallel to a top surface 102A-1 of the signal line 102A in the circuit 102, and the conductive structure 104c may be disposed on the top surface 104b-1 of the conductive structure 104b and the top surface 102A-1 of the signal line 102A in the circuit 102. In accordance with some embodiments, on a plane (for example, the X-Y plane) perpendicular to the normal direction (Z direction) of the display substrate 100, the area of the conductive structure 104c may be greater than the area of the conductive structure 104b. In accordance with some embodiments, the conductive structure 104c disposed on the conductive structure 104b and the signal line 102A in the circuit 102 can improve the conductivity of the conductive via 104.

Furthermore, the material of the conductive structure 104c may be the same as or different from the material of the conductive structure 104b. In accordance with some embodiments, the conductive structure 104c and the through hole 104a and/or the conductive structure 104b may be formed in separate processes, but it is not limited thereto.

Figure 4:
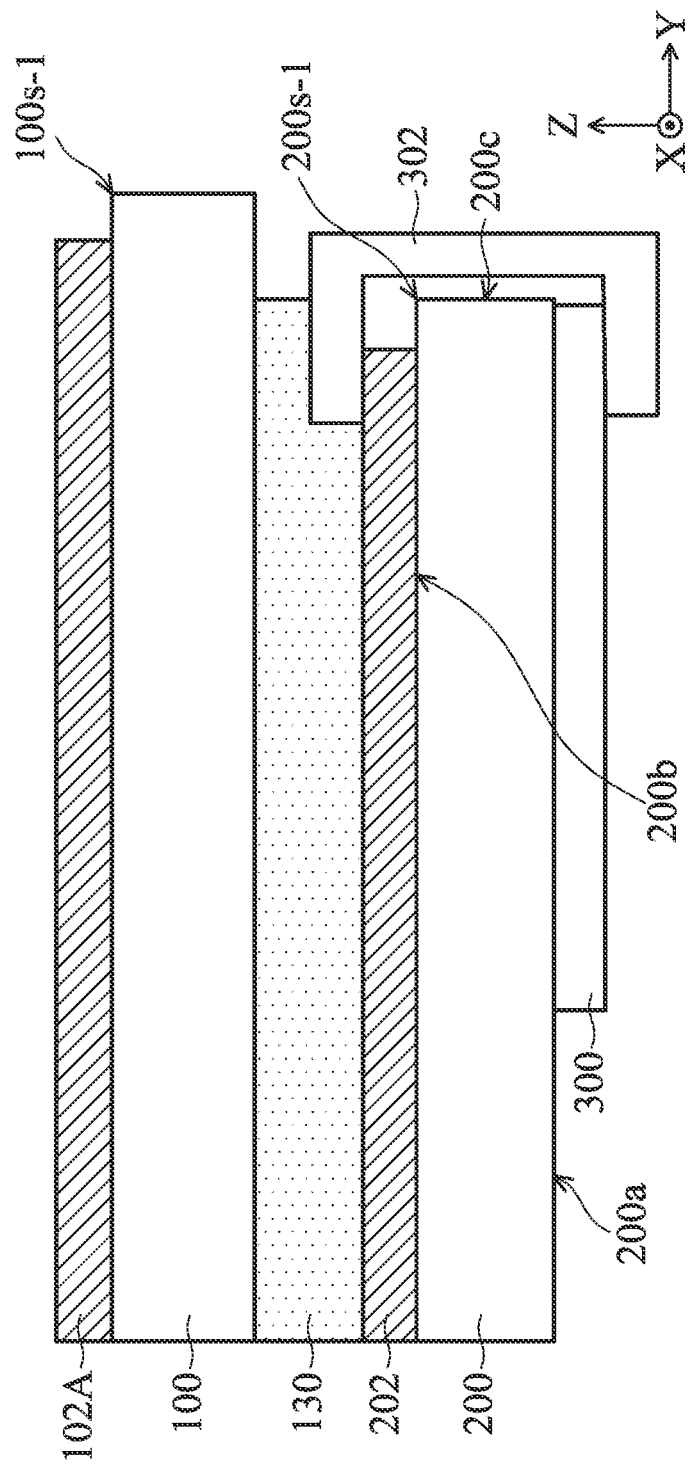
FIG. 4 is a side-view diagram of a display device in accordance with some embodiments of the present disclosure.

Next, refer to FIG. 4, which is a side-view diagram of the display device 10 in accordance with some embodiments of the present disclosure. Specifically, referring to FIG. 1 and FIG. 4, FIG. 4 is a side-view structure of the display device 10 viewed from the side 100s-2 or the side 100s-4 of the display substrate 100. Furthermore, FIG. 4 is the aspect where the flexible printed circuit board 302 is bent so that the circuit board 300 is disposed on the backside of the auxiliary substrate 200.

In detail, in accordance with some embodiments, the flexible printed circuit board 302 may be electrically connected to the auxiliary circuit 202 and the circuit board 300. The auxiliary circuit 202 may be disposed on an upper surface 200b of the auxiliary substrate 200, and the flexible printed circuit board 302 is bent so that the circuit board 300 may be disposed on a lower surface 200a of the auxiliary substrate 200. In addition, the lower surface 200a is opposite to the upper surface 200b, and the lower surface 200a is farther from the display substrate 100 than the upper surface 200b. Moreover, the circuit board 300 may be fixed to the lower surface 200a of the auxiliary substrate 200, or may not be fixed to the lower surface 200a of the auxiliary substrate 200 but merely adjacent to the lower surface 200a of the auxiliary substrate 200.

In accordance with some embodiments, the flexible printed circuit board 302 may be disposed on the upper surface 200b of the auxiliary substrate 200. In accordance with some other embodiments, the flexible printed circuit board 302 may be disposed on the upper surface 200b of the auxiliary substrate 200 and extend to a side surface 200c of the auxiliary substrate 200. In accordance with still some other embodiments, the flexible printed circuit board 302 may further extend to the lower surface 200a of the auxiliary substrate 200. Furthermore, in accordance with some embodiments, the flexible printed circuit board 302 may not be in contact with the side 200s-1. However, in accordance with some other embodiments, the flexible printed circuit board 302 may be in contact with the side 200s-1. In accordance with some embodiments, a portion of the flexible printed circuit board 302 may be disposed between the auxiliary circuit 202 and the functional layer 130, but it is not limited thereto.

In addition, as shown in FIG. 4, in accordance with some embodiments, the circuit board 300 may be disposed corresponding to the auxiliary substrate 200 in the normal direction (Z direction) of the display substrate 100. In other words, the circuit board 300 may at least partially overlap the auxiliary substrate 200 in the normal direction (Z direction) of the display substrate 100.

It should be noted that, with the configuration design of the display substrate 100, the auxiliary substrate 200 and the circuit board 300, the effect of a narrow border can be achieved. Specifically, the signal driving terminal can be disposed on the backside of the display substrate 100, or the signal driving terminal may be disposed on the auxiliary substrate 200 and the circuit board 300 (not labeled), thereby reducing the space occupied by related circuits or wirings on the front side of the display substrate 100, or reducing the area of the peripheral circuits on the front side of the display substrate 100. The gap between the two tiling panels can be reduced, or the space required for tiling position can be reduced. The front side of the display substrate 100 described in the embodiment is defined as the surface where the light-emitting element 120 (refer to FIG. 1) is disposed, and the backside is defined as the side opposite to the surface where the light-emitting element 120 is disposed.

Figure 5:
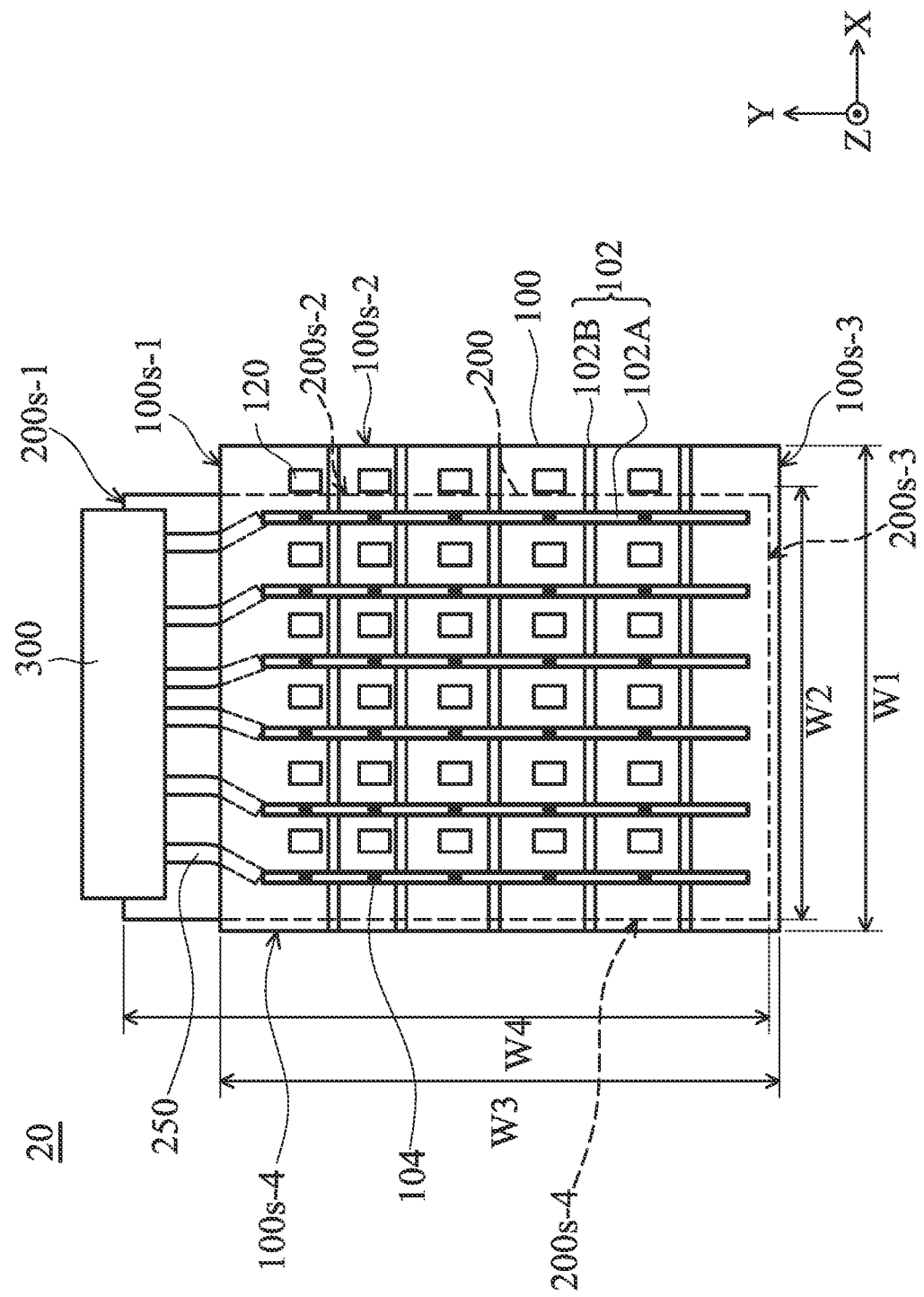
FIG. 5 is a top-view diagram of a display device in accordance with some embodiments of the present disclosure.

Next, refer to FIG. 5, which is a top-view diagram of a display device 20 in accordance with some other embodiments of the present disclosure. It should be understood that, for clear description, some elements of the display device 20 are omitted in the drawing, and only some elements are shown schematically. In accordance with some embodiments, additional features can be added to the display device 20 described below. In accordance with some other embodiments, some of the features of the display device 20 described below may be replaced or omitted.

As shown in FIG. 5, in accordance with some embodiments, the display device 20 may further include a conductive pattern 250, that is, when the display device 20 is flattened (for example, in the unbent or unfolded state), the conductive pattern 250 may be at least partially overlapped with the circuit board 300 in the normal direction (Z direction) of the display substrate 100. In addition, the circuit board 300 may be electrically connected to the auxiliary substrate 200 through the conductive pattern 250. In other words, the auxiliary circuit (not labeled) on the auxiliary substrate 200 may be electrically connected to the circuit board 300 through the conductive pattern 250. In accordance with some embodiments, the conductive pattern 250 may be disposed on the auxiliary substrate 200, and a portion of the conductive pattern 250 may not overlap the display substrate 100 in the normal direction (Z direction) of the display substrate 100.

In this embodiment, the auxiliary substrate 200 may be a flexible substrate, and the auxiliary substrate 200 can be bent to place the circuit board 300 on one surface (not labeled) of the auxiliary substrate 200. More specifically, when the auxiliary substrate 200 is in a bent state (not illustrated), the circuit board 300 may overlap the display substrate 100 in the normal direction (Z direction) of the display substrate 100. It should be understood that although the conductive pattern 250 illustrated in the embodiment shown in FIG. 5 is merely adjacent to the side 100s-1 of the display substrate 100, the present disclosure is not limited thereto. In accordance with some other embodiments, the conductive pattern 250 may be adjacent to the side 100s-2, the side 100s-3, the side 100s-4 of the display substrate 100, or a plurality of sides of the display substrate 100. In addition, in accordance with some embodiments, the conductive pattern 250 may include a plurality of sub-patterns, and the conductive pattern 250 may have a straight line, a curved line, a bending line, or any other suitable shape. In accordance with some embodiments, the conductive pattern 250 may be a portion of the auxiliary circuit (not labeled) on the auxiliary substrate 200. In other words, the auxiliary circuit (not labeled) may extend to an edge of the auxiliary substrate 200 (for example, near the side 200s-1) and be electrically connected to the circuit board 300.

In accordance with some embodiments, the material of the conductive pattern 250 may include a metal conductive material, a transparent conductive material, another suitable material, or a combination thereof, but it is not limited thereto. The metal conductive material may include copper, silver, gold, tin, aluminum, molybdenum, tungsten, chromium, nickel, platinum, titanium, any of the foregoing metal alloys, another suitable material, or a combination thereof, but it is not limited thereto. The transparent conductive material may include a transparent conductive oxide, such as indium tin oxide, antimony zinc oxide, tin oxide, zinc oxide, indium zinc oxide, indium gallium zinc oxide, indium tin zinc oxide, antimony tin oxide, another suitable transparent conductive material, or a combination thereof, but it is not limited thereto. Furthermore, the material of the conductive pattern 250 may be the same as or different from the material of the auxiliary circuit on the auxiliary substrate 200.

In accordance with some embodiments, if the auxiliary circuit and the conductive pattern 250 are formed of the same material, the conductive pattern 250 is defined as the portion that overlaps the circuit board 300 in the normal direction (for example, the Z direction shown in the figure) of the auxiliary substrate 200. In accordance with some embodiments, if the auxiliary circuit and the conductive pattern 250 are formed of different materials, the portion that is formed of different material from that of the auxiliary circuit is the conductive pattern 250.

In addition, as shown in FIG. 5, in this embodiment, the side 200s-4 of the auxiliary substrate 200 may be adjacent to the side 100s-4 of the display substrate 100. Since a space for bending the auxiliary substrate 200 should be reserved, in the Y direction, the width W4 of the side 200s-4 of the auxiliary substrate 200 without bending is greater than the width W3 of the side 100s-4 of the display substrate 100. In accordance with some embodiments, a ratio of the width W4 of the side 200s-4 of the auxiliary substrate 200 to the width W3 of the side 100s-4 of the display substrate 100 may be in a range from 1.05 to 2.5 ($1.05 \leq$ ratio W4/W3 $\leq 2.5$), or in a range from 1.5 to 2, for example, 1.6, 1.7, 1.8 or 1.9, but it is not limited thereto.

It should be noted that if the ratio of the width W4 of the side 200s-4 to the width W3 of the side 100s-4 is too small, the length of the auxiliary substrate 200 may not be sufficient to bend to the backside of the display substrate 100. If the ratio of the width W4 of the side 200s-4 to the width W3 of the side 100s-4 is too large, the length of the auxiliary substrate 200 may be too long, and the space of tiling the panels may not be reduced.

Figure 6:
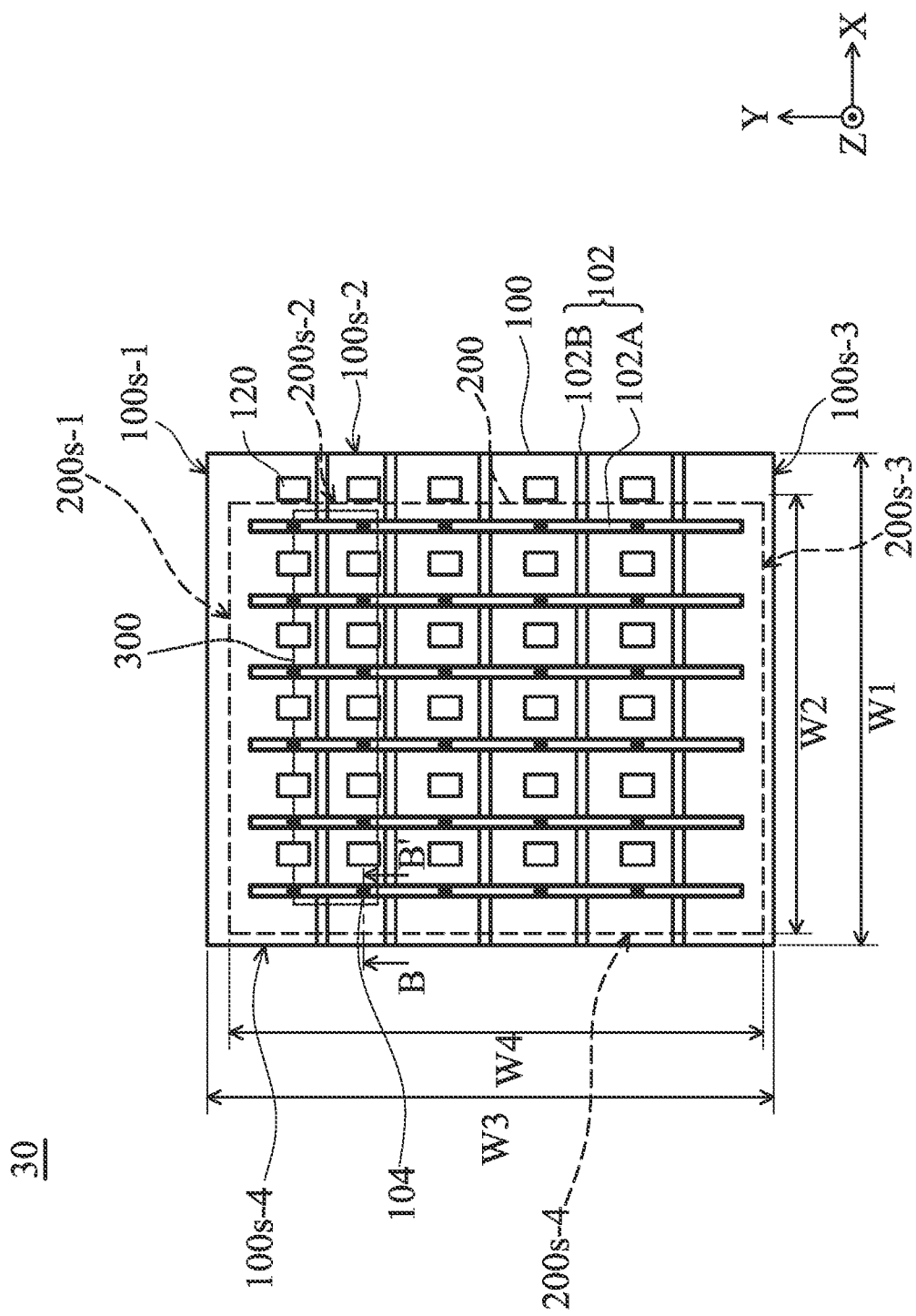
FIG. 6 is a top-view diagram of a display device in accordance with some embodiments of the present disclosure.
Figure 7:
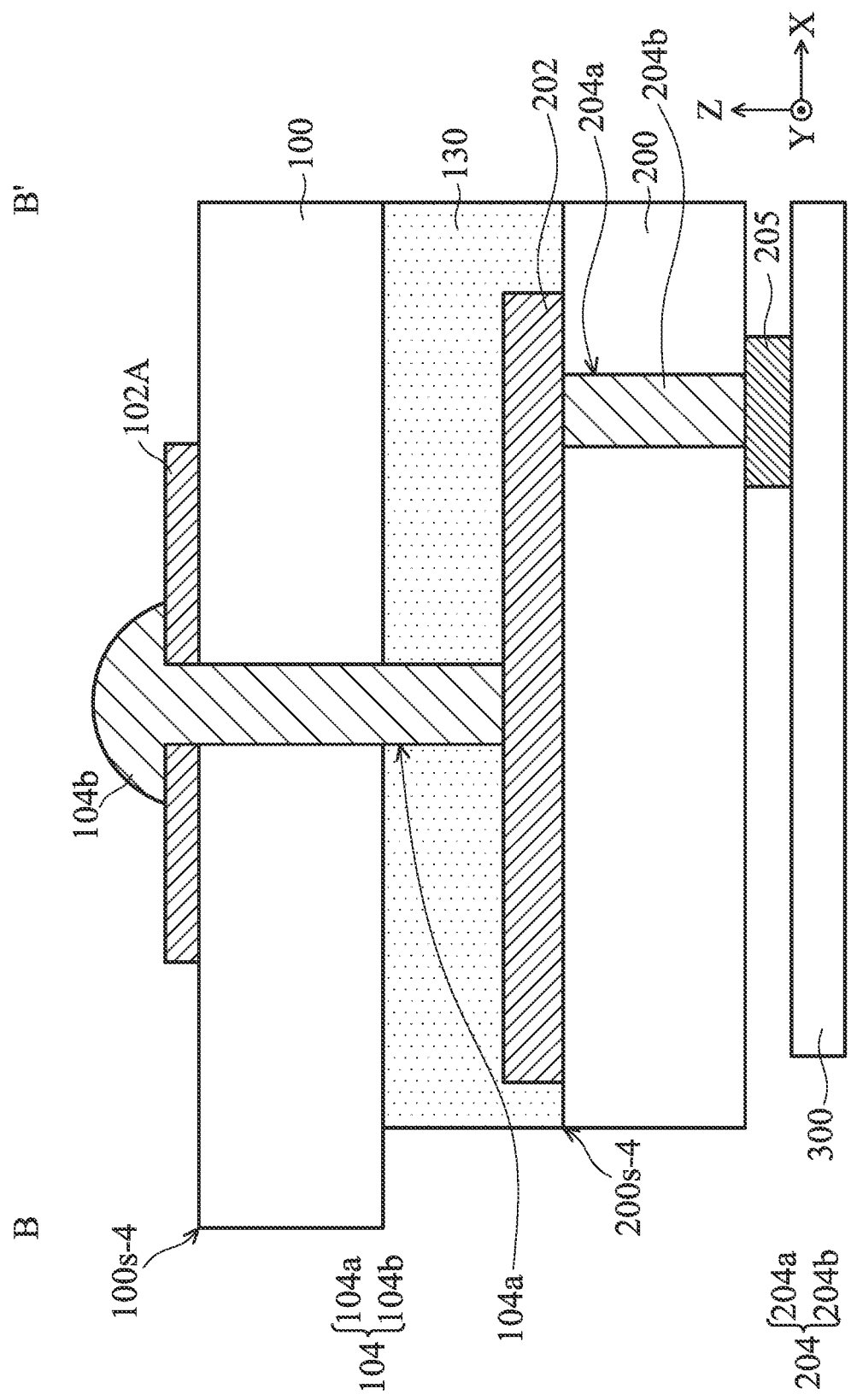
FIG. 7 is a cross-sectional diagram of the display device taken along section line B-B' in FIG. 6 in accordance with some embodiments of the present disclosure.

Next, refer to FIG. 6 and FIG. 7. FIG. 6 is a top-view diagram of a display device 30 in accordance with some other embodiments of the present disclosure. FIG. 7 is a cross-sectional diagram of the display device 30 taken along section line B-B' in FIG. 6 in accordance with some embodiments of the present disclosure. It should be understood that, for clear description, some elements of the display device 30 are omitted in the drawing, and only some elements are shown schematically. In accordance with some embodiments, additional features can be added to the display device 30 described below. In accordance with some other embodiments, some of the features of the display device 30 described below may be replaced or omitted.

As shown in FIG. 6 and FIG. 7, in accordance with some embodiments, the auxiliary circuit 202 may be electrically connected to the circuit board 300 through a conductive via 204. In this embodiment, as shown in FIG. 7, the circuit board 300 may be disposed on the surface of the auxiliary substrate 200 farther from the display substrate 100 without bending the flexible printed circuit board (not illustrated) or bending the auxiliary substrate 200. In other words, the circuit board 300 may be disposed below the auxiliary substrate 200. Furthermore, in this embodiment, the auxiliary circuit 202 may be disposed between the conductive via 104 and the conductive via 204, and the auxiliary circuit 202 may be electrically connected to the conductive via 104 and the conductive via 204.

In accordance with some embodiments, the conductive via 204 may include a through hole 204a and a conductive structure 204b. The conductive structure 204b may be disposed in the through hole 204a, and the through hole 204a may penetrate through the auxiliary substrate 200. In accordance with some embodiments, the display device 30 may further include a conductive layer 205, and the conductive layer 205 may be disposed between the conductive via 204 and the circuit board 300. On the other hand, the conductive via 104 may include the through hole 104a and the conductive structure 104b, and the circuit 102 (for example, the signal line 102A of the circuit 102) may be electrically connected to the auxiliary circuit 202 through the conductive via 104.

In accordance with some embodiments, the material of the conductive structure 204b may include a conductive material, such as a metal conductive material. In accordance with some embodiments, the metal conductive material may include, aluminum, molybdenum, silver, tin, tungsten, gold, chromium, nickel, platinum, copper alloy, aluminum alloy, molybdenum alloy, silver alloy, tin alloy, tungsten alloy, gold alloy, chromium alloy, nickel alloy, platinum alloy, another suitable metal material, or a combination thereof, but it is not limited thereto. In accordance with some embodiments, the material of the conductive layer 205 may include an anisotropic conductive film (ACF), another suitable conductive adhesive, or a combination thereof, but it is not limited thereto.

Figure 8:
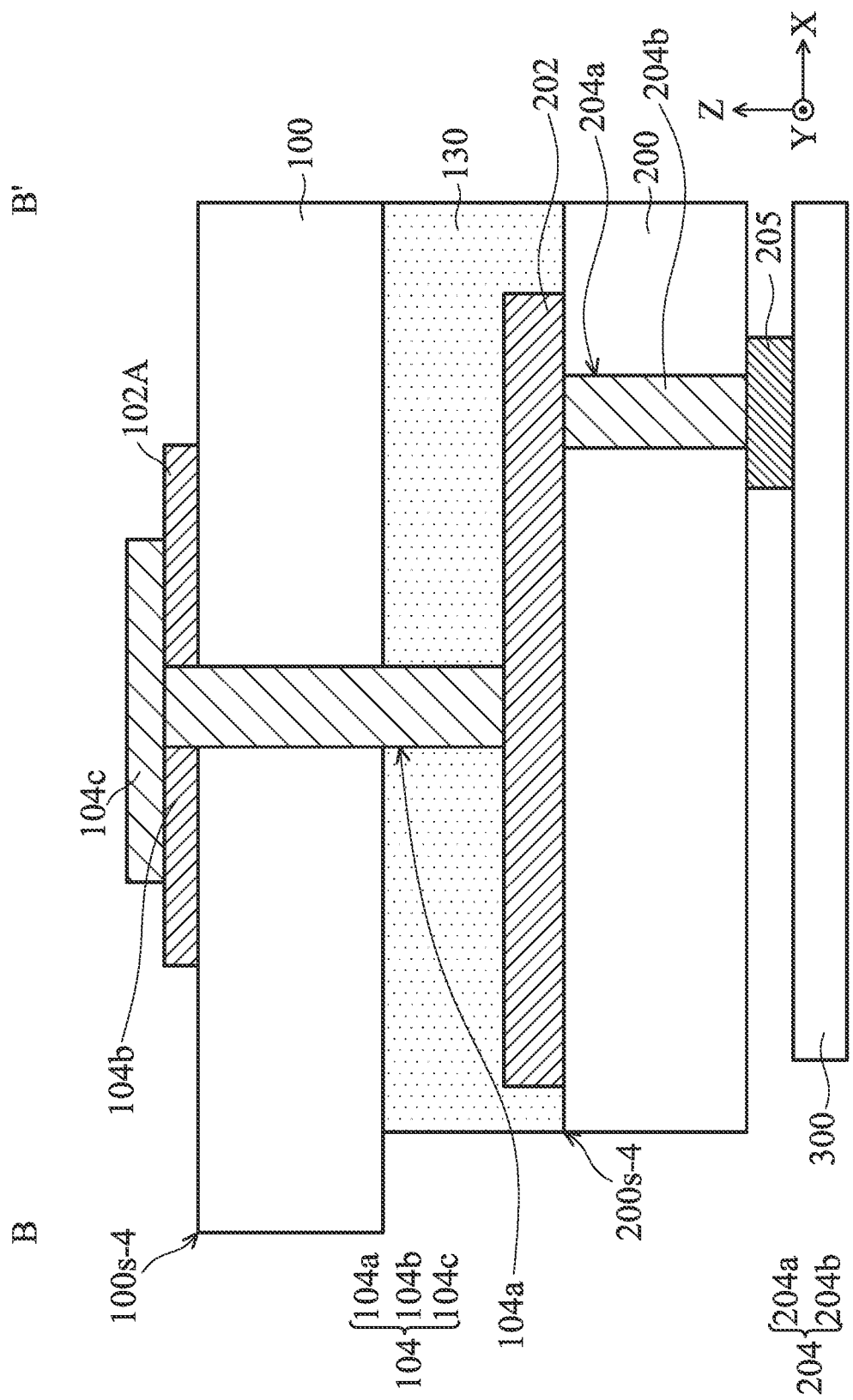
FIG. 8 is a cross-sectional diagram of the display device taken along section line B-B' in FIG. 6 in accordance with some embodiments of the present disclosure.

Next, refer to FIG. 8, which is a cross-sectional diagram of the display device 30 taken along section line B-B' in FIG. 6 in accordance with some other embodiments of the present disclosure. The embodiment shown in FIG. 8 is substantially the same as the embodiment shown in FIG. 7. The difference between them may include that, in the embodiment shown in FIG. 8, conductive via 104 may further include a conductive structure 104c, and the conductive structure 104c may be disposed on the conductive structure 104b and/or the circuit 102 (for example, the signal line 102A of the circuit 102). For a description of the conductive structure 104c, please refer to the relevant description in FIG. 3, which will not be repeated herein.

Figure 9:
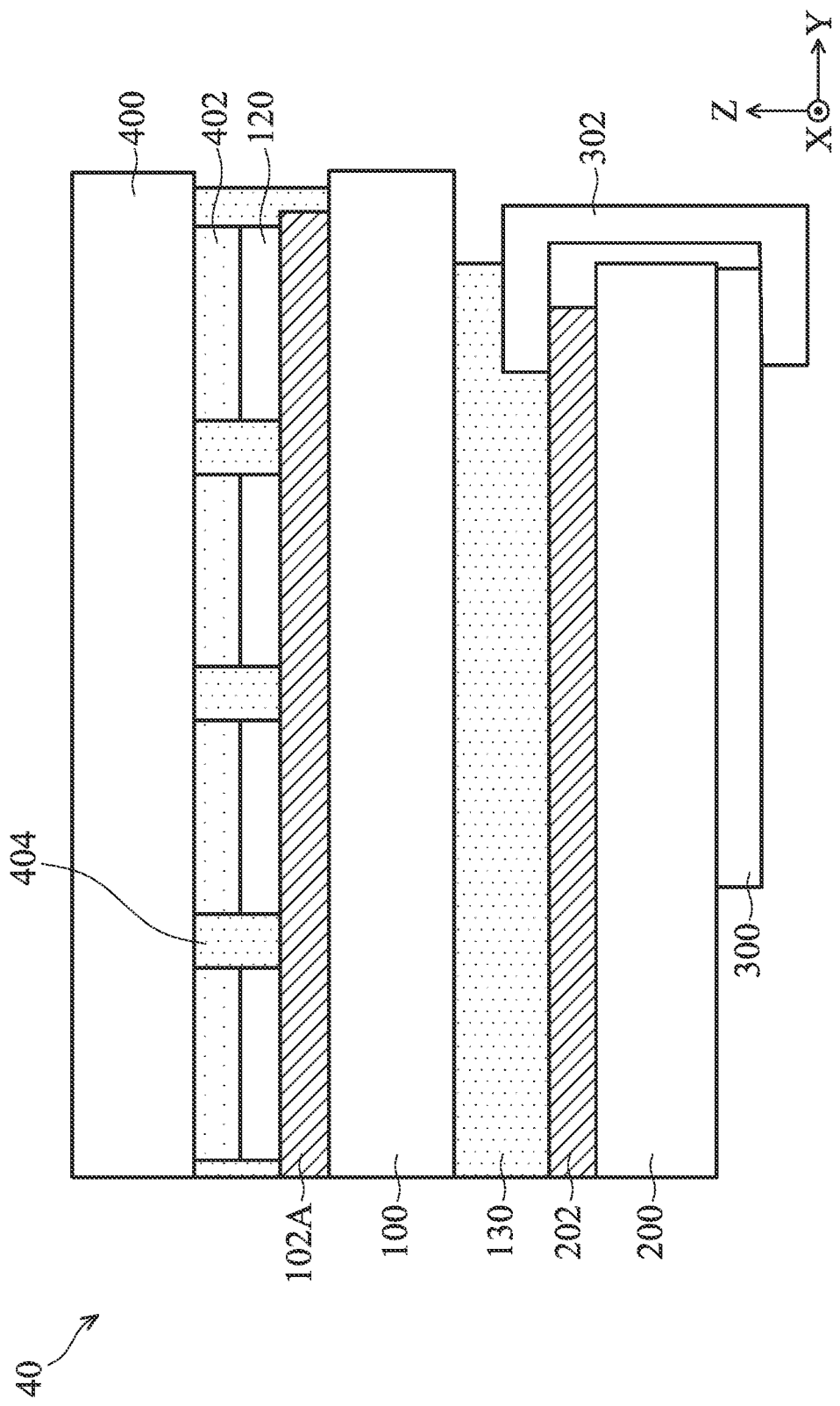
FIG. 9 is a side-view diagram of a display device in accordance with some embodiments of the present disclosure.

Next, refer to FIG. 9, which is a side-view diagram of a display device 40 in accordance with some other embodiments of the present disclosure. It should be understood that, for clear description, some elements of the display device 40 are omitted in the drawing, and only some elements are schematically shown. In accordance with some embodiments, additional features can be added to the display device 40 described below. In accordance with some other embodiments, some of the features of the display device 40 described below may be replaced or omitted.

The embodiment shown in FIG. 9 is substantially the same as the embodiment shown in FIG. 4. The difference between them may include that, in the embodiment shown in FIG. 9, the display device 40 may also include a cover substrate 400, a wavelength conversion layer 402, and a functional layer 404. In accordance with some embodiments, the cover substrate 400 may be disposed on the wavelength conversion layer 402 and the functional layer 404, and the cover substrate 400 may serve as a protective cover of the display device 40. In accordance with some embodiments, the wavelength conversion layer 402 may be disposed above the light-emitting elements 120 (not labeled), and may convert the light generated by the light-emitting elements 120 into a light of a specific color or wavelength. In accordance with some embodiments, the functional layer 404 may be disposed between the cover substrate 400 and the display substrate 100 and adjacent to the light-emitting elements 120 and the wavelength conversion layer 402. In accordance with some embodiments, the functional layer 404 may be also disposed on the auxiliary circuit 202.

In accordance with some embodiments, the material of cover substrate 400 may include glass, quartz, sapphire, ceramic, another suitable material, or a combination thereof, but it is not limited thereto. Furthermore, the material of the cover substrate 400 may be the same as or different from the material of the display substrate 100. In accordance with some embodiments, the side surface (not labeled) of the cover substrate 400 may be substantially aligned or not aligned with the side surface (not labeled) of the display substrate 100.

In accordance with some embodiments, the wavelength conversion layer 402 may include a polymer matrix or a glass matrix, and phosphors, quantum dot materials, or fluorescent materials dispersed in the matrix, but it is not limited thereto. In accordance with some embodiments, the quantum dot material may have a core-shell structure. The core may include CdSe, CdTe, CdS, ZnS, ZnSe, ZnO, ZnTe, InAs, InP, GaP, another suitable material, or a combination thereof, but it is not limited thereto. The shell may include ZnS, ZnSe, GaN, GaP, another suitable material, or a combination thereof, but it is not limited thereto.

In accordance with some embodiments, the material of the functional layer 404 may be the same as or similar to the material of the functional layer 130, and thus will not be repeated herein. In accordance with some embodiments, the functional layer 404 may cooperate with the light-emitting element 120 and the wavelength conversion layer 402 so that the light transmittance through the functional layer 404 may be greater than 90%. In accordance with some other embodiments, the functional layer 404 may include an encapsulation material. The encapsulation material may include an organic material, an inorganic material, other suitable encapsulation material, or a combination thereof, but it is not limited thereto. In accordance with some embodiments, the aforementioned inorganic material may include silicon nitride, silicon oxide, silicon oxynitride, aluminum oxide, or another suitable material, but it is not limited thereto. In accordance with some embodiments, the aforementioned organic material may include epoxy resins, silicone resins, acrylic resins (e.g., polymethylmetacrylate (PMMA)), benzocyclobutene (BCB), polyimide, polyester, polydimethylsiloxane (PDMS), polyfluoroalkoxy (PFA), another suitable material, or a combination thereof, but it is not limited thereto. In accordance with some other embodiments, the material of the functional layer 404 may include a light-curing adhesive material, a heat-curing adhesive material, a light and heat-curing adhesive material, another suitable material, or a combination thereof, but it is not limited thereto. For example, in some embodiments, the material of the functional layer 404 may include optical clear adhesive (OCA), optical clear resin (OCR), another suitable material, or a combination thereof.

Figure 10:
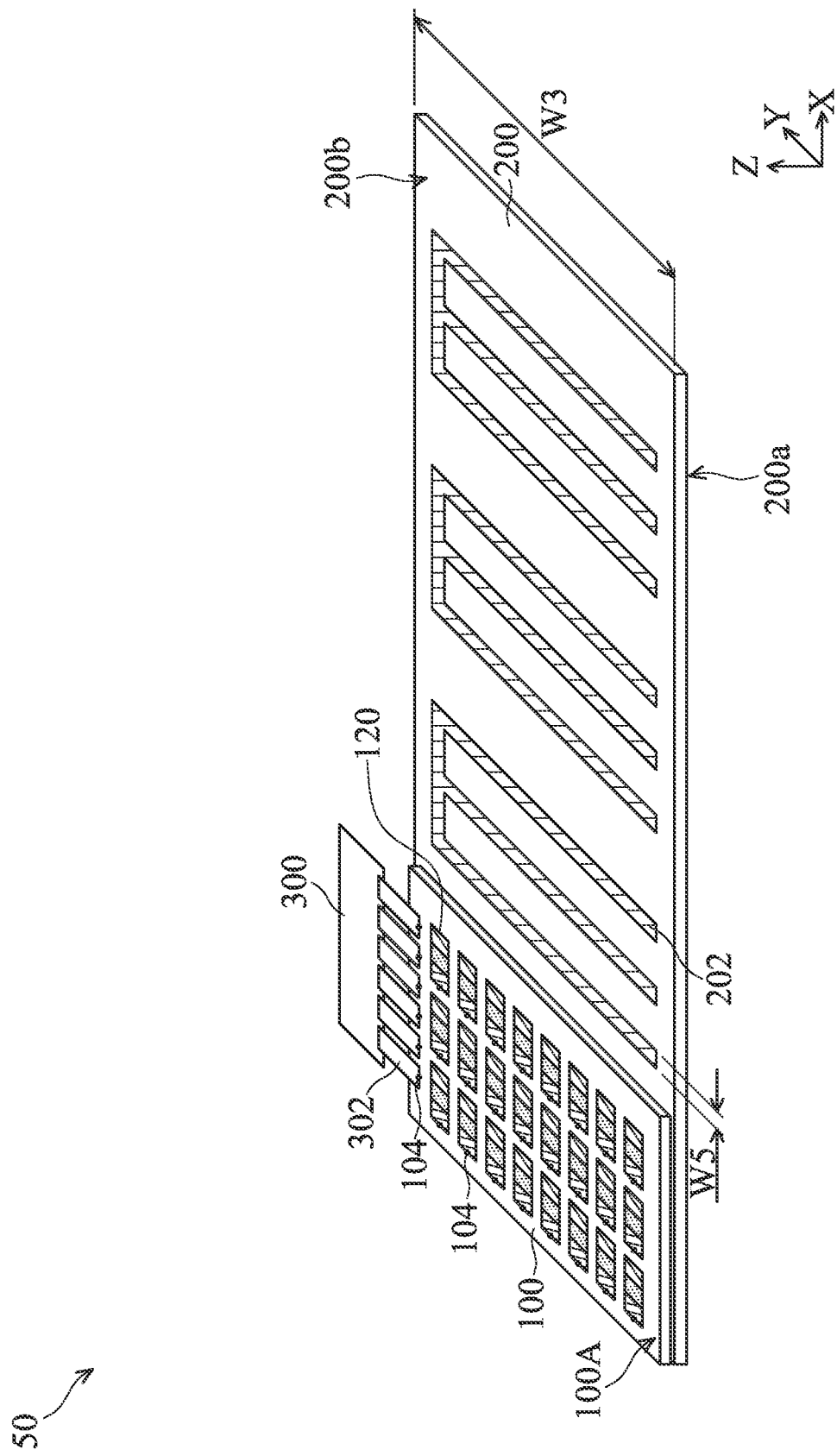
FIG. 10 is a structural diagram of a display device in accordance with some embodiments of the present disclosure.

Next, refer to FIG. 10, which is a structural diagram of a display device 50 in accordance with some other embodiments of the present disclosure. It should be understood that, for clear description, some elements of the display device 50 are omitted in the drawing, and only some elements are shown schematically. In accordance with some embodiments, additional features can be added to the display device 50 described below. In accordance with some other embodiments, some of the features of the display device 50 described below may be replaced or omitted.

As shown in FIG. 10, in accordance with some embodiments, the display device 50 may include a plurality of display substrates 100 (it should be understood that only one display substrate 100 is shown in the drawing for clarity), and the light-emitting elements 120 on the display substrate 100 may be electrically connected to the auxiliary circuit 202 on the auxiliary substrate 200 through the conductive via 104. In addition, the light-emitting elements 120 may be electrically connected to the circuit (such as the signal line 102A and the signal line 102B, as shown in FIG. 1 and FIG. 2) disposed on the display substrate 100. In accordance with some embodiments, the flexible printed circuit board 302 may also be electrically connected to the auxiliary circuit 202 on the auxiliary substrate 200 through the conductive via 104.

In this embodiment, the number of display substrates 100 may be greater than or equal to the number of auxiliary substrates 200. For example, four display substrates 100 are disposed on one auxiliary substrate 200, but the present disclosure is not limited thereto. In accordance with different embodiments, another suitable number of display substrates 100 may be disposed on the auxiliary substrate 200 according to needs. In this embodiment, on a plane (for example, the X-Y plane) perpendicular to the normal direction (Z direction) of the display substrate 100, the area of the auxiliary substrate 200 may be greater than the area of the display substrate 100.

In accordance with some embodiments, the auxiliary substrate 200 may include a plurality of auxiliary circuits 202 corresponding to the plurality of display substrates 100, and the flexible printed circuit board 302 may be electrically connected to the circuit (not illustrated, refer to the circuit 102 in FIG. 1) on the display substrate 100 and the circuit board 300. In addition, the flexible printed circuit board 302 may be disposed on the display substrate 100. In accordance with some embodiments, the flexible printed circuit board 302 may be disposed on the upper surface 100A of the display substrate 100, and may be bent and extend to the side surfaces of the display substrate 100 and the auxiliary substrate 200, and may further extend to the lower surface 200a of the auxiliary substrate 200.

In addition, in accordance with some other embodiments, the flexible printed circuit board 302 may be electrically connected to the auxiliary circuit 202 and the circuit board 300, and the flexible printed circuit board 302 may be disposed on the auxiliary substrate 202. In addition, in the normal direction (Z direction) of the display substrate 100, the display substrate 100 may be partially overlapped with the flexible printed circuit board 302. In accordance with some embodiments, the flexible printed circuit board 302 may be disposed on the upper surface 200b of the auxiliary substrate 200, and may be bent and extend to the side surface of the auxiliary substrate 200, and may further extend to the lower surface 200a of the auxiliary substrate 200.

It should be noted that a plurality of display substrates 100 disposed on the auxiliary substrate 200 may shorten the length of the circuit 102 on the display substrate 100 or reduce the IR drop caused by the excessively long signal transmission path. Specifically, it can reduce the IR drop caused by the excessively large width of the display substrate 100 (such as the width W3) when a signal (such as a data signal, but it is not limited thereto) is transmitted on the circuit (such as the circuit 102 in FIG. 1) in the display substrate 100. The quality of signal transmission can therefore be improved.

It should be noted that the auxiliary circuit 202 on the auxiliary substrate 200 may be simplified compared to the circuit on the display substrate 100. In other words, the circuit on the display substrate 100 may be a data line, a scan line, etc., but the present disclosure is not limited thereto, and the auxiliary circuit 202 may be designed for circuits having severe IR drop problems, such as a power line (VDD) or a common voltage line (VSS). In accordance with some embodiments, a wide or thick auxiliary circuit 202 may be disposed on the auxiliary substrate 200 to improve the quality of signal transmission, or reduce the situation of IR drop, thereby reducing the brightness uniformity of the light-emitting elements 120 on the display substrate 100. For example, the width (width W5) of the auxiliary circuit 202 is designed to be greater than the width of the corresponding circuit on the display substrate 100. In another example, the thickness (not illustrated) of the auxiliary circuit 202 is designed to be greater than the thickness of the corresponding circuit on the display substrate 100. The aforementioned "thickness of the auxiliary circuit 202" and "thickness of the circuit on the display substrate 100" may be referred to the maximum thickness measured in the normal direction (Z direction) of the display substrate 100.

Next, refer to FIG. 11A, which is a structural diagram of a display device 60 before assembly in accordance with some other embodiments of the present disclosure. FIG. 11A shows a schematic diagram of the structure of the display device 60 before assembly according to other embodiments of the present disclosure. It should be understood that, for clear description, some elements of the display device 60 are omitted in the drawing, and only some elements are shown schematically. In accordance with some embodiments, additional features can be added to the display device 60 described below. In accordance with some other embodiments, some of the features of the display device 60 described below may be replaced or omitted.

As shown in FIG. 11A, in accordance with some embodiments, a plurality of display substrates 100 may be disposed on the auxiliary substrate 200. For the convenience of description, the display substrates 100 are labeled as 100-1, 100-2, and 100-3. The display substrate 100-1, the display substrate 100-2 and the display substrate 100-3 may respectively have a circuit 102, and the circuits 102 may be electrically connected to the light-emitting elements 120. In this embodiment, the auxiliary circuit 202 may include branch circuits 202a, branch circuits 202b, and branch circuits 202c with different lengths. For example, as shown in FIG. 11A, the length of branch circuit 202c may be greater than the length of branch circuit 202b. The length of branch circuit 202b may be greater than the length of branch circuit 202a. In accordance with some embodiments, the branch circuit 202a, the branch circuit 202b, and the branch circuit 202c may have bent portions (for example, a bent portion 202c-1), and may be staggered from other circuits. That is, the branch circuit 202a, the branch circuit 202b, and the branch circuit 202c may change the extension direction in the respective bending portions, so that the branch circuit 202a, the branch circuit 202b, and the branch circuit 202c can be staggered from other circuits.

In addition, it should be understood that although six branch circuits (two branch circuits 202a, two branch circuits 202b, and two branch circuits 202c) are shown in the drawing, the number of branch circuits of the auxiliary circuit 202 is not limited thereto. According to different embodiments, the auxiliary circuit 202 may have other suitable number of branch circuits. In addition, a branch circuit illustrated in the drawing may actually include a plurality of conductive wires.

As shown in FIG. 11A, in accordance with some embodiments, the branch circuit 202a may have an end portion A1, the branch circuit 202b may have an end portion A2, and the branch circuit 202c may have an end portion A3. In accordance with some embodiments, the display substrate 100-1 may be electrically connected to the end portion A1 of the branch circuit 202a, the display substrate 100-2 may be electrically connected to the end portion A2 of the branch circuit 202b, and the display substrate 100-3 may be electrically connected to the end portion A3 of the branch circuit 202c. After assembly, in the normal direction (for example, the Z direction shown in the figure) of the auxiliary substrate 200, the circuit 102 of the display substrate 100-1 may overlap the end portion A1 of the branch circuit 202a; the circuit 102 of the display substrate 100-2 may overlap the end portion A2 of the branch circuit 202b; and the circuit 102 of the display substrate 100-3 may overlap the end portion A3 of the branch circuit 202c.

Refer to FIG. 11B, which is a side-view diagram of a portion of the display device 60 in accordance with some embodiments of the present disclosure. Referring to FIG. 11A and FIG. 11B, the display substrate 100 may have an upper surface, a lower surface and a side surface. The upper surface is opposite the lower surface, and the side surface is connected to the upper surface and the lower surface. It should be noted that the upper surface of the display substrate 100 may be the surface viewed from the top view.

In this embodiment, the circuit 102 on the display substrate 100 may have a transmission portion 102-1 and a connection portion 102-2, and the connection portion 102-2 may be electrically connected to the transmission portion 102-1. In detail, FIG. 11B illustrates a side view of the display substrate 100 (for example, the display substrate 100-1). As shown in FIG. 11A and FIG. 11B, the display substrate 100-1 may have an upper surface 100-1A, a lower surface 100-1B, and a side surface 100-1C. The upper surface 100-1A may be opposite to the lower surface 100-1B, and the side surface 100-1C may be connected to the upper surface 100-1A and the lower surface 100-1B. In accordance with some embodiments, the upper surface 100-1A may be connected to the side surface 100-1C, and the side 100s-1 may be a connecting line between the upper surface 100-1A and the side surface 100-1C. In an embodiment, the connection portion 102-2 of the circuit 102 may be disposed on the side surface 100-1C of the display substrate 100-1. In accordance with some embodiments, the transmission portion 102-1 of the circuit 102 may be disposed on the upper surface 100-1A of the display substrate 100-1, and the transmission portion 102-1 of the circuit 102 may extend from the upper surface 100-1A of the display substrate 100-1 to the side 100s-1. It should be noted that the circuit 102 located on the side surface 100-1C may be the connection portion 102-2 of the circuit 102. In accordance with some embodiments, the connection portion 102-2 of the circuit 102 may further extend to the lower surface 100-1B of the display substrate 100-1, but the present disclosure is not limited thereto. The transmission portion 102-1 of the circuit 102 on the upper surface 100-1A of the display substrate 100-1 may be electrically connected to the auxiliary circuit 202 (for example, the branch circuit 202a) through the connection portion 102-2 of the circuit 102, and the circuit board 300 may provide signals to the auxiliary circuit 202. Specifically, the connection portion 102-2 of the circuit 102 may extend to the lower surface 100-1B of the display substrate 100-1 and be electrically connected to the branch circuit 202a of the auxiliary circuit 202 (for example, may connect to the end portion A1 of the branch circuit 202a). However, in accordance with some other embodiments, the transmission portion 102-1 of the circuit 102 may also be electrically connected to the branch circuit 202a of the auxiliary circuit 202 through a conductive via (not illustrated, refer to the conductive via 104 in FIG. 10) penetrating through the display substrate 100-1, but the present disclosure is not limited thereto.

In accordance with some embodiments, the transmission portion 102-1 of the circuit 102 and the connection portion 102-2 of the circuit 102 may be formed of the same material. In accordance with some other embodiments, the transmission portion 102-1 of the circuit 102 and the connection portion 102-2 of the circuit 102 may be formed of different materials. In accordance with some embodiments, if the transmission portion 102-1 of the circuit 102 and the connection portion 102-2 of the circuit 102 are formed of different materials, the transmission portion 102-1 may be disposed on the upper surface 100-1A of the display substrate 100-1 and adjacent to the side 100s-1. The transmission portion 102-1 may be electrically connected to the connection portion 102-2 disposed on the side surface 100-1C of the display substrate 100-1, and then the connection portion 102-2 may extend to the side surface 100-1C of the display the substrate 100-1, and may further extend to the lower surface 100-1B of the display substrate 100-1. With the design of the transmission portion 102-1 of the circuit 102 and the connection portion 102-2 of the circuit 102 to be made of different materials, the selectivity of the connection portion 102-2 of the circuit 102 may be increased (for example, a conductive material with better conductivity can be selected), or the quality of conductivity may be improved. The materials of the transmission portion 102-1 and the connection portion 102-2 of the circuit 102 are the same as or slimier to the material of the circuit 102 mentioned above, and will not be repeated herein. In addition, it should be understood that the foregoing description is provided by using the display substrate 100-1 as an example, and the display substrate 100-2 and the display substrate 100-3 may also have similar structures, and thus will not be repeated herein.

Figure 11C:
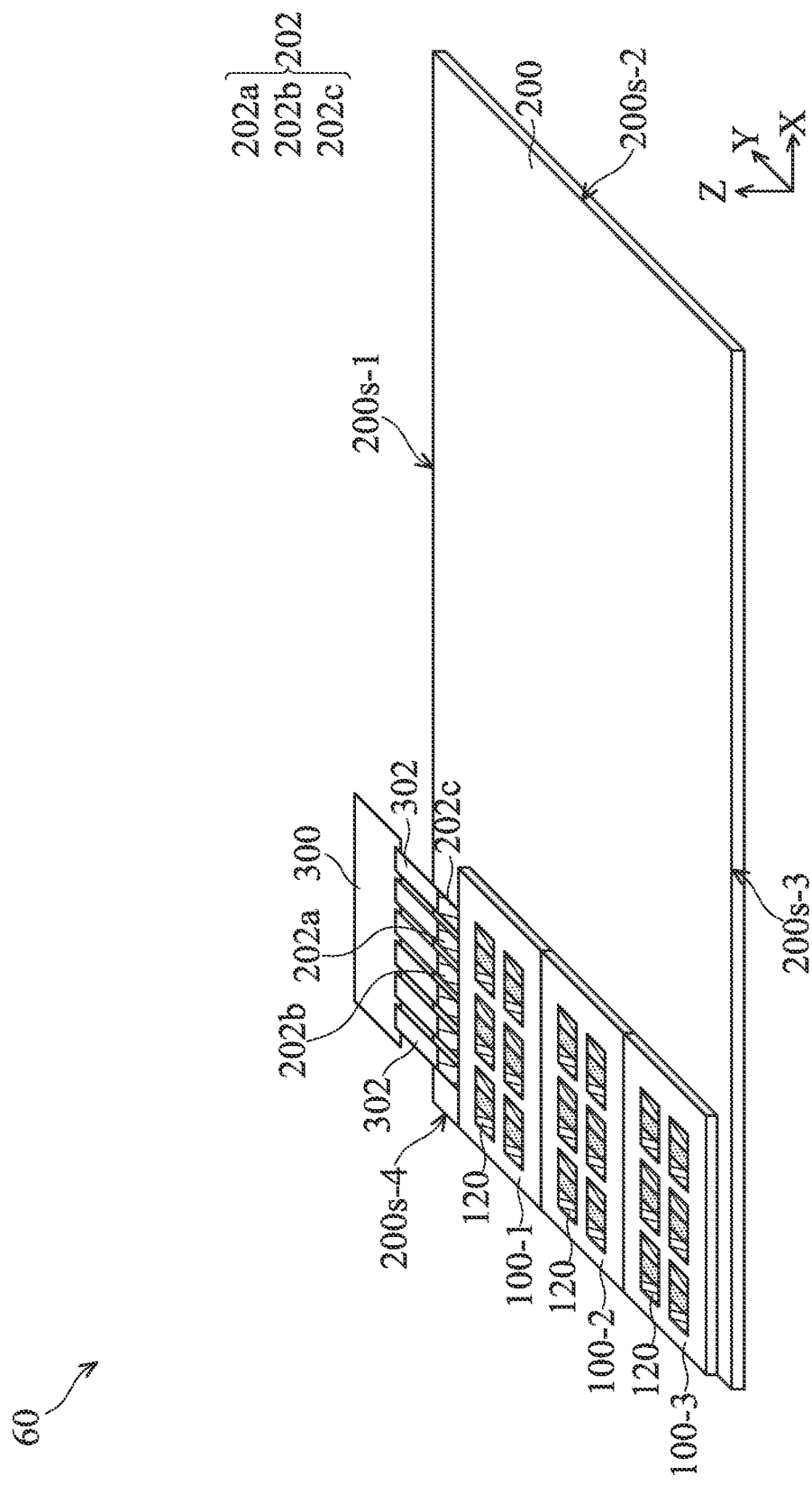
FIG. 11C is a structural diagram of a display device in accordance with some embodiments of the present disclosure.

Next, refer to FIG. 11C, which is a structural diagram of the display device 60 shown in FIG. 11A after assembly in accordance with some embodiments of the present disclosure. As shown in FIG. 11C, in accordance with some embodiments, in the normal direction (for example, the Z direction shown in the figure) of the auxiliary substrate 200, the display substrate 100-1, the display substrate 100-2, and the display substrate 100-3 may overlap the same set of auxiliary circuit 202 (for example, auxiliary circuit 202 connected to the same circuit board 300).

It should be noted that the arrangement of the display substrate 100-1, the display substrate 100-2, and the display substrate 100-3 may further reduce the length of the circuit 102 disposed on the display substrate 100. The IR drop problem caused by excessively long circuits may be reduced, or the quality of signal transmission may be improved.

Figure 12:
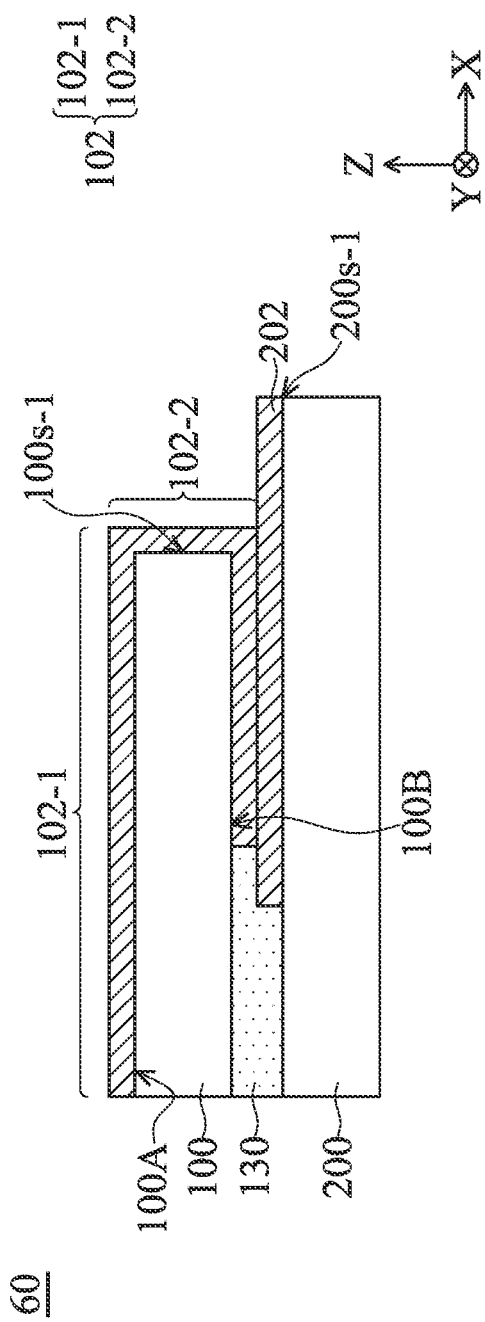
FIG. 12 is a side-view diagram of a display device in accordance with some embodiments of the present disclosure.
Figure 13:
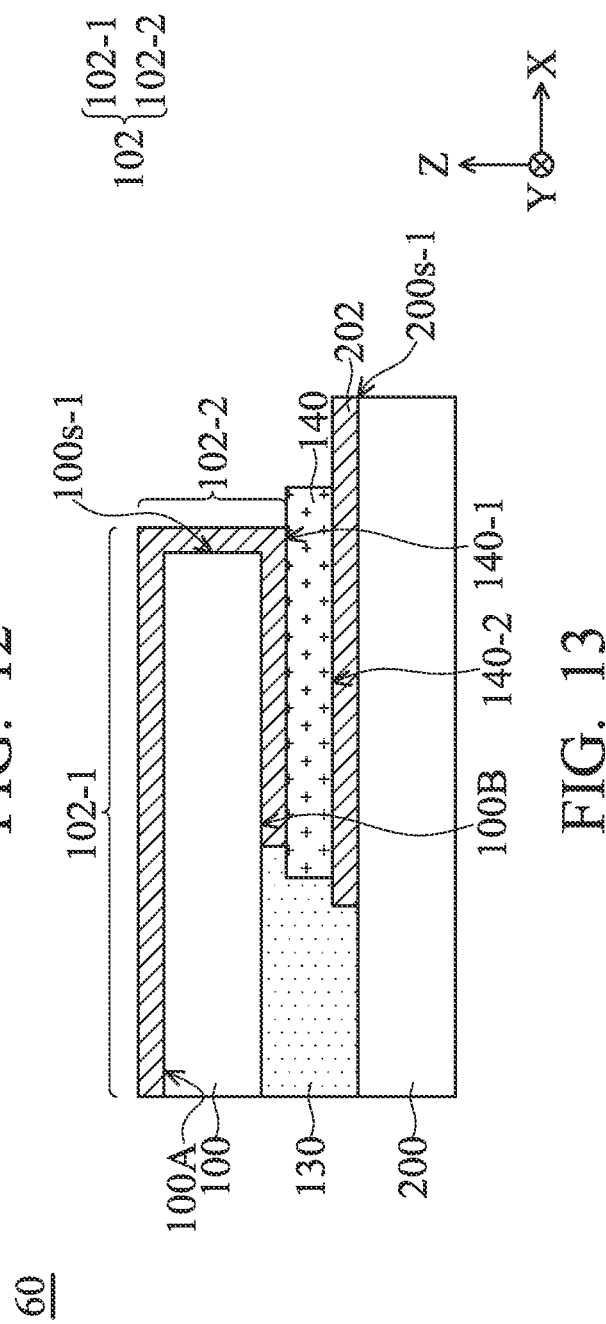
FIG. 13 is a side-view diagram of a display device in accordance with some embodiments of the present disclosure.

Next, refer to FIG. 12 and FIG. 13, which are side-view diagrams of the display device 60 in accordance with some embodiments of the present disclosure. Specifically, FIG. 12 and FIG. 13 are side-view structures of the display device 60 viewed from the side of the auxiliary substrate 200. It should be understood that, in order to clearly describe the connection relationship between the circuit 102 and the auxiliary circuit 202, some elements of the display device 60 (including the flexible printed circuit board 302) are omitted in the drawing, and only some of the elements are shown schematically.

As shown in FIG. 12, in accordance with some embodiments, the circuit 102 located on the upper surface 100A of the display substrate 100 can be regarded as the transmission portion 102-1 of the circuit 102, and the portion of the circuit 102 that is not transmission portion 102-1 can be regarded as the connection portion 102-2 of the circuit 102. In an embodiment, the connection portion 102-2 extending to the lower surface 100B may be electrically connected to the auxiliary circuit 202. In accordance with some embodiments, the functional layer 130 may be disposed between the display substrate 100 and the auxiliary substrate 200 to fix the display substrate 100 to the auxiliary substrate 200 to increase the stability of the display device 60. As described above, in accordance with some embodiments, the functional layer 130 may protect the auxiliary circuit 202 through such characteristics as moisture-proofing or insulation, but it is not limited thereto. In accordance with some embodiments, the connection portion 102-2 may be electrically connected to the auxiliary circuit 202 by using a eutectic bonding process, but the present disclosure is not limited thereto.

As shown in FIG. 13, in accordance with some other embodiments, the display device 60 may further include another functional layer 140. The functional layer 140 may be disposed between the connection portion 102-2 and the auxiliary circuit 202 and connected to both the circuit 102 and the auxiliary circuit 202. In detail, a surface 140-1 of the functional layer 140 may be connected to the connection portion 102-2 of the circuit 102, and the other surface 140-2 of the functional layer 140 may be connected to the auxiliary circuit 202. The functional layer 140 may have a conductive function. For example, the functional layer 140 may be an adhesive, a film, or a coating with a conductive function, but it is not limited thereto. In accordance with some embodiments, the material of the functional layer 140 may include an anisotropic conductive film (ACF), another suitable conductive adhesive, or a combination thereof, but it is not limited thereto. In addition, it should be understood that although not shown in the drawings, in accordance with some embodiments, the aforementioned display device may exist in a tiled form. For example, the display device may include at least two sets of display devices (display device 10, display device 20, display device 30, display device 40, display device 50, or display device 60) (for example, including at least two display substrates 100 and at least two auxiliary substrates 200) as described in the above embodiments, and the two sets of display devices are adjacent to each other and tiled together.

To summarize the above, in accordance with some embodiments of the present disclosure, a display device is provided. In the provided display device, the signal driving terminal can be disposed on the backside of the display substrate with the configuration design of the display substrate, the auxiliary substrate and the circuit board, which can reduce the space occupied by the related circuits or wiring on the front of the display substrate, or can reduce the area of the peripheral circuit on the front of the display substrate, or resulting in a narrow border effect. The gap between the two tiled panels can be reduced, or the space required for the tiling panels can be reduced. In accordance with some embodiments of the present disclosure, the provided display device can improve the reliability of panel-tiling technique or increase its availability ratio in high-resolution display devices. That is, the display area of the display panel can be increased and the peripheral area of the display panel can be reduced. The interference of the gap at the panel-tiling position on the image display quality can be reduced, or the seamless visual effect can be substantially achieved. In accordance with some other embodiments, the provided display device can reduce the IR drop issue, or may reduce brightness uniformity of the light-emitting elements on the display substrate or improve the quality of signal transmission.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A display device, comprising:
an auxiliary substrate, the auxiliary substrate comprising an auxiliary circuit;
a display substrate disposed on the auxiliary substrate, the display substrate comprising a circuit;
a functional layer disposed between the display substrate and the auxiliary substrate; and
a circuit board electrically connected to the auxiliary substrate;
wherein the circuit of the display substrate is electrically connected to the auxiliary circuit through a first conductive via, and the circuit board provides a signal to the auxiliary circuit,
wherein the first conductive via comprises a through hole penetrating through the circuit of the display substrate, the display substrate and the functional layer, a first conductive structure, and a second conductive structure,
the first conductive structure is disposed in the through hole and the second conductive structure is disposed on the first conductive structure and the circuit.

2. The display device as claimed in claim 1, wherein the circuit board is at least partially overlapped with the auxiliary substrate in a normal direction of the display substrate.

3. The display device as claimed in claim 1, further comprising a flexible printed circuit board, wherein the auxiliary circuit is electrically connected to the circuit board through the flexible printed circuit board.

4. The display device as claimed in claim 1, further comprising a conductive pattern, wherein the conductive pattern is disposed on the auxiliary substrate, the auxiliary substrate is a flexible substrate, and the circuit board is electrically connected to the auxiliary substrate through the conductive pattern, and the circuit board is at least overlapped with the display substrate in a normal direction of the display substrate when the auxiliary substrate is bent.

5. The display device as claimed in claim 4, wherein a portion of the conductive pattern is not overlapped with the display substrate in the normal direction of the display substrate.

6. The display device as claimed in claim 1, wherein the circuit board is disposed on a surface of the auxiliary substrate that is farther from the display substrate, and the auxiliary circuit is electrically connected to the circuit board through a second conductive via.

7. The display device as claimed in claim 1, wherein the display substrate has a first side and the auxiliary substrate has a second side, the first side is adjacent to the second side, and a width of the first side is greater than a width of the second side.

8. The display device as claimed in claim 7, wherein the display substrate has a third side, the third side is connected to the first side, and the auxiliary substrate has a fourth side, the fourth side is connected to the second side, the third side is adjacent to the fourth side, and a width of the fourth side is greater than a width of the third side.

9. The display device as claimed in claim 1, wherein the circuit comprises a plurality of signal lines, and a maximum distance between the first conductive structure and an upper surface of the display substrate is greater than a maximum distance between one of the plurality of signal lines and the upper surface of the display substrate.

10. The display device as claimed in claim 1, wherein the circuit comprises a plurality of signal lines, and a top surface of the first conductive structure is aligned with a top surface of one of the plurality of signal lines.

11. The display device as claimed in claim 1, wherein an area of the auxiliary substrate is different from an area of the display substrate.

12. A display device, comprising:
an auxiliary substrate, the auxiliary substrate comprising an auxiliary circuit;
a display substrate disposed on the auxiliary substrate, wherein the display substrate has an upper surface, a lower surface, a first side surface and a second side surface, the upper surface is opposite the lower surface, the first side surface is opposite the second side surface, the first side surface and the second side surface are connected to the upper surface and the lower surface, the display substrate comprises a circuit, the circuit has a transmission portion and a connection portion connected to the transmission portion, the transmission portion is disposed on the upper surface, and the connection portion is disposed on the first side surface; and
a circuit board adjacent to the first side surface of the display substrate and electrically connected to the auxiliary substrate;
wherein the transmission portion of the circuit is electrically connected to the auxiliary circuit through the connection portion, the circuit board provides a signal to the auxiliary circuit, and the first side surface is between the second side surface and the circuit board.

13. The display device as claimed in claim 12, wherein the transmission portion and the connection portion are made of a same material.

14. The display device as claimed in claim 12, wherein the transmission portion and the connection portion are made of different materials.

15. The display device as claimed in claim 12, wherein an area of the auxiliary substrate is greater than an area of the display substrate.

16. The display device as claimed in claim 12, wherein the auxiliary circuit comprises a plurality of branch circuits with different lengths.

17. The display device as claimed in claim 16, wherein the plurality of branch circuits have bent portions and are staggered from each other.

18. The display device as claimed in claim 16, wherein the display substrate is electrically connected to an end portion of at least one of the plurality of branch circuits.

* * * * *